(12) United States Patent
Shin et al.

(10) Patent No.: US 7,531,413 B2
(45) Date of Patent: May 12, 2009

(54) METHOD OF FORMING TRANSISTOR HAVING CHANNEL REGION AT SIDEWALL OF CHANNEL PORTION HOLE

(75) Inventors: Soo-Ho Shin, Gyeonggi-do (KR); Jin-Woo Lee, Gyeonggi-do (KR); Eun-Cheol Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 219 days.

(21) Appl. No.: 11/156,271

(22) Filed: Jun. 17, 2005

(65) Prior Publication Data

US 2005/0282343 A1 Dec. 22, 2005

(30) Foreign Application Priority Data

Jun. 17, 2004 (KR) .................. 10-2004-0045145

(51) Int. Cl.
*H01L 21/336* (2006.01)
*H01L 21/3205* (2006.01)
(52) U.S. Cl. ................. 438/270; 438/589; 257/E21.429
(58) Field of Classification Search ................. 438/270, 438/589; 257/E21.429
See application file for complete search history.

(56) References Cited

U.S. PATENT DOCUMENTS 5,016,067 A    5/1991 Mori

| 5,923,063 | A  | * | 7/1999  | Liu et al. ................... 257/316 |
| 6,165,825 | A  | * | 12/2000 | Odake ........................ 438/217 |
| 6,281,562 | B1 | * | 8/2001  | Segawa et al. .............. 257/510 |
| 6,649,479 | B2 | * | 11/2003 | Park et al. ................... 438/279 |
| 7,094,644 | B2 | * | 8/2006  | Kim ........................... 438/259 |

FOREIGN PATENT DOCUMENTS

| JP | 55-82468     | 6/1980 |
| KR | 2002-0056259 | 7/2002 |
| KR | 2003-0055791 | 7/2003 |

OTHER PUBLICATIONS

English language abstract of Japanese Publication No. 55-82468.
English language abstract of Korean Publication No. 2002-0056259.
English language abstract of Korean Publication No. 2003-0055791.

* cited by examiner

*Primary Examiner*—Walter L Lindsay, Jr.
*Assistant Examiner*—Ron E Pompey
(74) *Attorney, Agent, or Firm*—Marger Johnson & McCollom, P.C.

(57) ABSTRACT

According to some embodiments of the invention, a method of forming a transistor includes forming a device isolation layer in a semiconductor substrate. The device isolation layer is formed to define at least one active region. A channel region is formed in a predetermined portion of the active region of the semiconductor substrate. Two channel portion holes are formed to extend downward from a main surface of the semiconductor substrate to be in contact with the channel region. Gate patterns fill the channel portion holes and cross the active region. The resulting transistor is capable of ensuring a constant threshold voltage without being affected by an alignment state of the channel portion hole and the gate pattern.

23 Claims, 19 Drawing Sheets

METHOD OF FORMING TRANSISTOR HAVING CHANNEL REGION AT SIDEWALL OF CHANNEL PORTION HOLE

CROSS-REFERENCE TO RELATED APPLICATIONS

This patent application claims priority from Korean Patent Application No. 2004-45145, filed on Jun. 17, 2004, the content of which is hereby incorporated by reference in its entirety.

BACKGROUND

1. Field of the Invention

This disclosure relates to methods of forming a transistor and, more particularly, to methods of forming a transistor having a channel region at a predetermined sidewall of a channel portion hole.

2. Description of the Related Art

In recent years, processing techniques for increasing pattern fidelity in a semiconductor fabrication process with respect to a design drawing has been applied to semiconductor devices in order to pursue high integration and high speed. To this end, the semiconductor devices may include transistors having various structures.

Each of the transistors has a gate pattern, source and drain regions, and a channel region. The gate pattern is disposed on the semiconductor substrate, and the source and drain regions are disposed in the semiconductor substrate to overlap the gate pattern. The channel region is disposed in the semiconductor substrate below the gate pattern to be in contact with the source and drain regions. In addition, the semiconductor substrate along with the gate pattern, the channel region, and the source and drain regions may be connected to electrical terminals.

However, as design rules for the transistor continue to be reduced, the shorter the channel region of the gate pattern must become. To cope with this result, the gate pattern may be changed to have another shape. Accordingly, the transistor further includes channel portion holes in order to increase the effective channel length of the gate pattern. The channel portion hole is a trench that is disposed in the semiconductor substrate. In this case, the channel portion hole is filled with the gate pattern, and the gate pattern increases the effective channel length by using a sidewall of the channel portion hole. At this time, the gate pattern is generally formed to extend upward from a main surface of the semiconductor substrate. When the channel region is formed in the semiconductor substrate by using the gate pattern as a mask, the channel region may not overlap the gate pattern due to a shadow phenomenon of the gate pattern. On the other hand, U.S. Pat. No. 5,016,067 to Kiyoshi Mori, et al. (the '067 patent) discloses a vertical MOS transistor.

According to the '067 patent, the transistor includes a trench, a gate pattern, source and drain regions, and a channel region. The trench is disposed in the semiconductor substrate. The gate pattern is disposed in the trench to conformally fill the trench. The source region, the channel region, and the drain region are vertically disposed in the semiconductor substrate in order to be in contact with a sidewall of the trench.

However, when the transistor has a vertical structure in which the source region, the channel region, and the drain region surround the sidewall of the trench, a width of the channel region may not be limited to the sidewall of the trench. This is the reason that the width of the channel region is determined by diffusion of dopants of the source and drain regions. The diffusion of the dopants of the source and drain regions depends on a semiconductor thermal process applied to the semiconductor substrate. Accordingly, a threshold voltage of the transistor may be partially changed over the whole semiconductor substrate as the size of the semiconductor substrate is increased or as the design rule of the transistor is decreased.

Embodiments of the invention address these and other limitations of the related art.

SUMMARY

A method according to some embodiments of the invention includes forming a transistor having a channel region on a sidewall of a channel portion hole, the transistor capable of ensuring a constant threshold voltage without being affected by an alignment state of the channel portion hole and a gate pattern.

A method according to some embodiments of the invention include forming a transistor for a dynamic random access memory (DRAM) cell, the transistor having a channel region on a sidewall of a channel portion hole, the transistor capable of ensuring a constant threshold voltage without being affected by an alignment state of the channel portion hole and a word line pattern.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION

Figure 1:
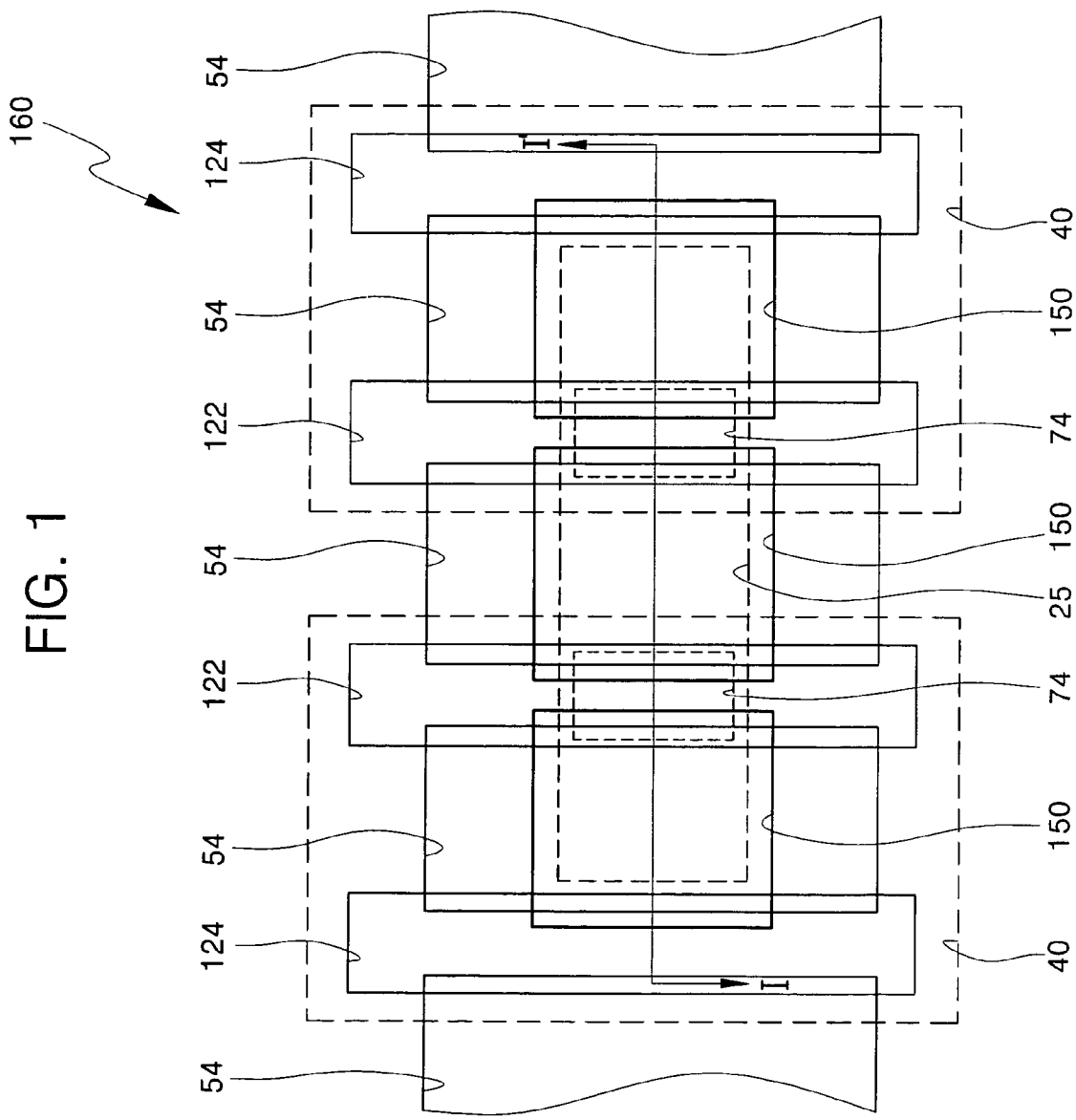
FIG. 1 is a plan diagram illustrating a transistor manufactured according to some embodiments of the invention.

FIG. 1 is a plan diagram illustrating a transistor manufactured according to some embodiments of the invention. FIGS. 2 to 11 are cross-sectional diagrams illustrating a method of forming the transistor of FIG. 1 according to some embodiments of the invention. FIGS. 2 to 11 are taken along the line I-I' of FIG. 1 and are helpful in illustrating the formation of a channel region and channel portion holes.

Referring to FIGS. 1 to 4, a device isolation layer 20 is formed in a semiconductor substrate 10 to define at least one active region 25. A pad layer 30 is formed in the active region 25 of the semiconductor substrate 10. The pad layer 30 is formed of an insulating material, for example, a silicon oxide ($SiO_2$), which has an etching ratio different from that of the device isolation layer 20. The pad layer 30 is preferably formed in a dry atmosphere ($O_2$) by using a semiconductor thermal oxidation process. The pad layer 30 may be formed in a wet atmosphere ($H_2O$) by using a semiconductor thermal oxidation process. In this case, the pad layer 30 is grown in the active region 25 of the semiconductor substrate 10 to have a predetermined thickness. Alternatively, the pad layer 30 may not be formed in the active region 25 of the semiconductor substrate 10.

An ion implantation process 35 is performed on a surface of the semiconductor substrate having the pad layer 30. The ion implantation process 35 can be performed by using the device isolation layer 20 as a mask to implant a dopant material into the semiconductor substrate 10. Preferably, the dopant material consists of P-type impurity ions. Accordingly, the ion implantation process 35 can be performed with boron ions having a dose of about $1.0 \times 10^{13}$ to $5.0 \times 10^{13}$ ions/cm$^2$ and an energy of about 300 to 600 KeV (1 KeV=1000 electron volts). When the active region 25 is the DRAM cell 160 of FIG. 1, the ion implantation process 35 preferably uses P-type impurity ions to form a P-type well region 38 in the semiconductor substrate 10. Alternatively, when the active region 25 is not the DRAM cell 160, the ion implantation process 35 may use P-type or N-type impurity ions to form a P-type or an N-type well region in the semiconductor substrate 10. The N-type impurity ions are preferably formed by using phosphorus (P) ions having a dose of about $1.0 \times 10^{13}$ to $5.0 \times 10^{13}$ ions/cm$^2$ and an energy of about 500 to 900 KeV.

Photoresist patterns 40 are formed on the semiconductor substrate having the P-type well region 38. The photoresist patterns 40 expose the pad layer 30 positioned on the active region 25 of the semiconductor substrate 10. When the pad layer 30 is not formed on the active region 25 of the semiconductor substrate 10, the photoresist patterns 40 may expose a predetermined portion of the active region 25 of the semiconductor substrate 10. A dopant material is implanted into the semiconductor substrate 10 between the photoresist patterns 40 by performing an ion implantation process 44 on the semiconductor substrate using the photoresist patterns as a mask. The dopant material preferably consists of P-type impurity ions. Accordingly, the ion implantation process 44 can be performed with boron ions having an energy of about 30 to 50 KeV and a dose of about $1.0 \times 10^{13}$ to $2.0 \times 10^{13}$ ions/cm$^2$. The ion implantation process 44 may also be performed with boron fluoride (BF$_2$) ions having an energy of about 20 to 50 KeV and a dose of about $0.5 \times 10^{13}$ to $1.0 \times 10^{13}$ ions/cm$^2$ together with boron ions having an energy of about 30 to 50 KeV and a dose of about $0.5 \times 10^{13}$ to $1.5 \times 10^{13}$ ions/cm$^2$. At this time, when the active region 25 is the DRAM cell 160 of FIG. 1, the ion implantation process 44 uses P-type impurity ions to form a P-type channel region 48 in the active region 25 of the semiconductor substrate 10. Alternatively, when the active region 25 is not the DRAM cell 160, the ion implantation process 44 may use P-type or N-type impurity ions to form a P-type or N-type channel region in the active region 25 of the semiconductor substrate 10. The N-type channel region is formed by using phosphorus (P) or arsenic (As) ions having the same energy and dose as described above. The channel region 48 is preferably formed to be positioned between the channel portion holes 74 of FIG. 1.

After forming the channel region 48, the photoresist patterns 40 are removed from the semiconductor substrate 10. A Rapid Thermal Process (RTP) is then performed on the semiconductor substrate having the well region 38 and the channel region 48 to activate the impurity ions.

Referring to FIGS. 1 and 5-9, a mask layer 50 and a photoresist layer 60 are sequentially formed on the semiconductor substrate having the channel region 48. The mask layer 50 is preferably formed of an insulating material having an etching ratio different from that of the pad layer 30. The mask layer 50 is preferably formed of an insulating material having an etching ratio different from that of the semiconductor substrate 10. The mask layer 50 may be formed of a silicon oxynitride (SiON) or a silicon nitride (Si$_3$N$_4$).

A photolithography process is performed on the photoresist layer 60 to form photoresist patterns 63 on the mask layer 50. An etching process 66 is performed on the mask layer 50 by using the photoresist patterns 63 as an etching mask to expose the device isolation layer 20 and the pad layer 30. The etching process 66 forms mask layer patterns 54 on the device isolation layer 20 and the pad layer 30. When the pad layer 30 is not formed on the active region 25 of the semiconductor substrate 10, the etching process 66 may form the mask layer patterns 54 on the active region 25 of the semiconductor substrate 10 and the device isolation layer 20. One of the mask layer patterns 54 is preferably disposed above the channel region 48.

When the active region 25 is the DRAM cell 160 of FIG. 1, the etching process 66 preferably allows the mask layer patterns 54 disposed between the first and second word lines 122 and 124 to be parallel to the first and second word lines. Alternatively, when the active region 25 is not the DRAM cell 160, the etching process 66 may allow the mask layer patterns 54 disposed between the gate patterns to be parallel with the gate patterns. After forming the mask layer patterns 54, the photoresist patterns 63 are removed from the semiconductor substrate 10.

Figure 7:
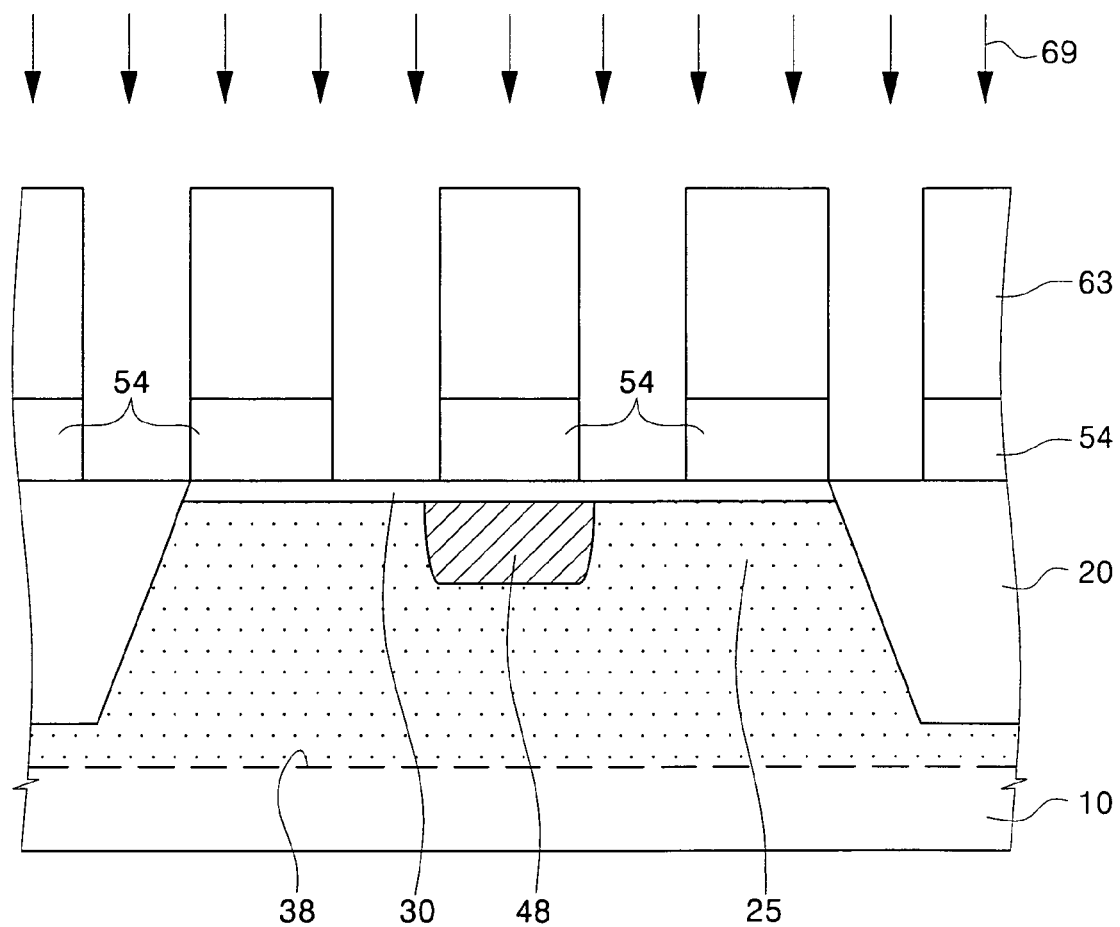

Next, referring to FIG. 7, an etching process 69 is performed on the pad layer 30 and the semiconductor substrate 10 by using the device isolation layer 20 together with the photoresist patterns 63 and the mask layer patterns 54 as an etching mask. The etching process 69 penetrates the pad layer 30 to form channel portion holes 74 in the active region 25 of the semiconductor substrate 10. When the pad layer 30 is not formed on the active region 25 of the semiconductor substrate 10, the etching process 69 may be performed on the semiconductor substrate 10 by using the device isolation layer 20 together with the photoresist patterns 63 and the mask layer patterns 54 as an etching mask.

Figure 8:
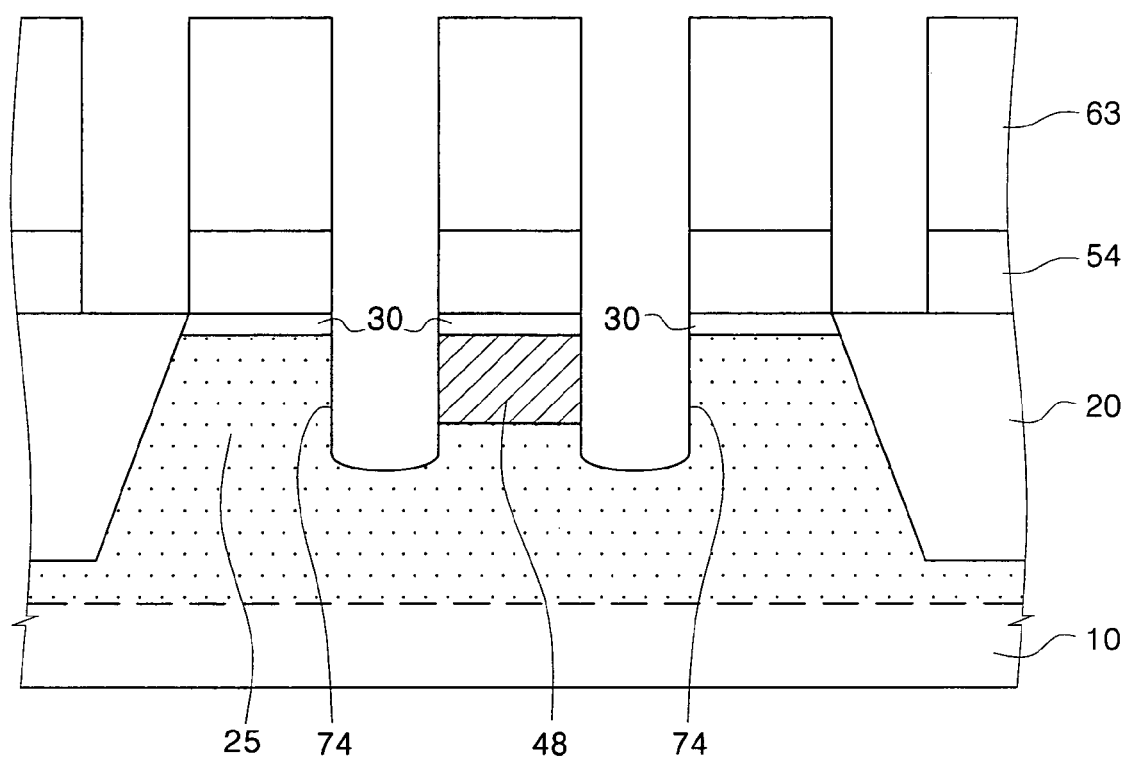

At this time, when the active region 25 is the DRAM cell 160 of FIG. 1, the etching process 69 is performed on the active region 25 to form two channel portion holes 74 in contact with the channel region 48 as shown in FIG. 8. That is, the channel portion holes 74 are formed to be spaced from each other, and to extend downward from the main surface of the semiconductor substrate 10. As such, the channel region 48 is formed between the channel portion holes 74.

Alternatively, when the active region 25 is not the DRAM cell 160, the etching process 69 may be performed on the active region 25 to form at least two channel portion holes 74 in contact with the channel region 48. That is, the channel portion holes 74 may be formed to be spaced from each other, and to extend downward from the main surface of the semiconductor substrate 10. As such, the channel region 48 is formed between the channel portion holes 74. After forming the channel portion holes 74, the photoresist patterns 63 are removed from the semiconductor substrate 10.

Figure 9:
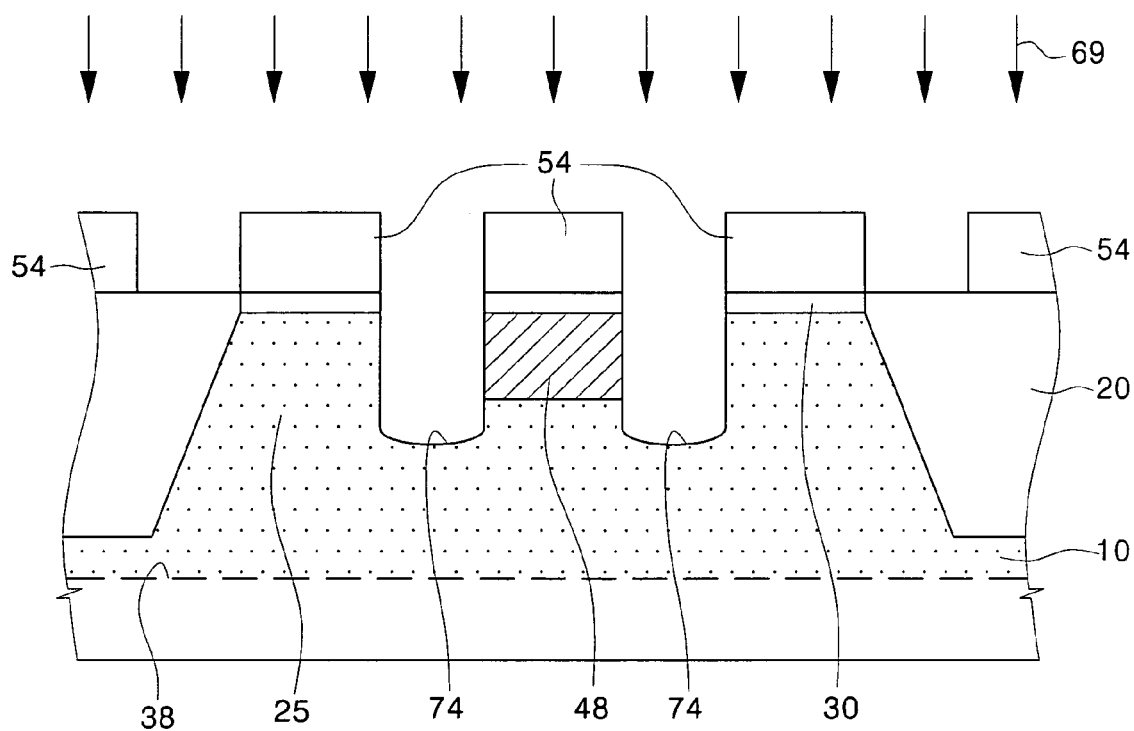

On the other hand, the photoresist patterns 63 may be removed before forming the channel portion holes 74 in the semiconductor substrate 10. At this time, the etching process 69 may be performed on the semiconductor substrate 10 by using the mask layer patterns 54 and the device isolation layer 20 as an etching mask. The etching process 69 penetrates the pad layer 30 to form the channel portion holes 74 in the semiconductor substrate 10 as shown in FIG. 9.

Figure 10:
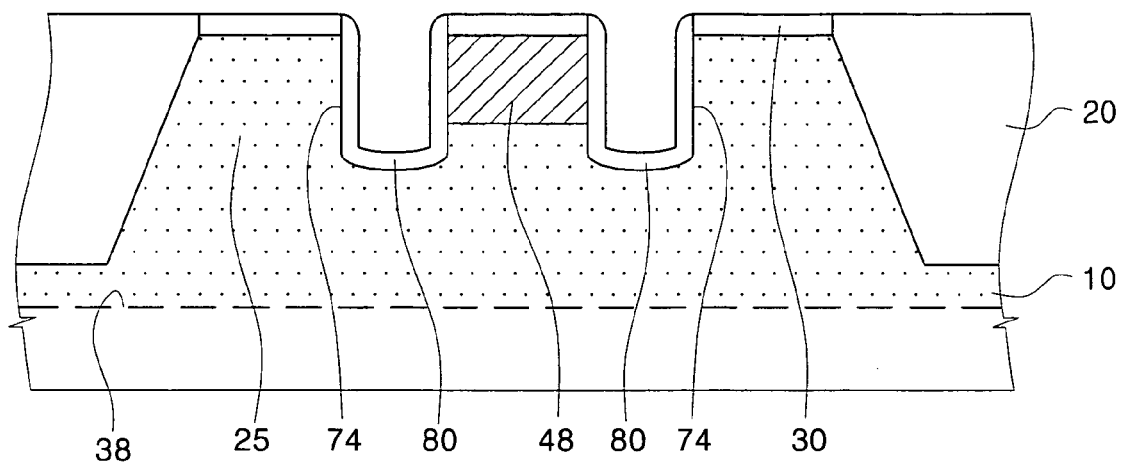
Figure 11:
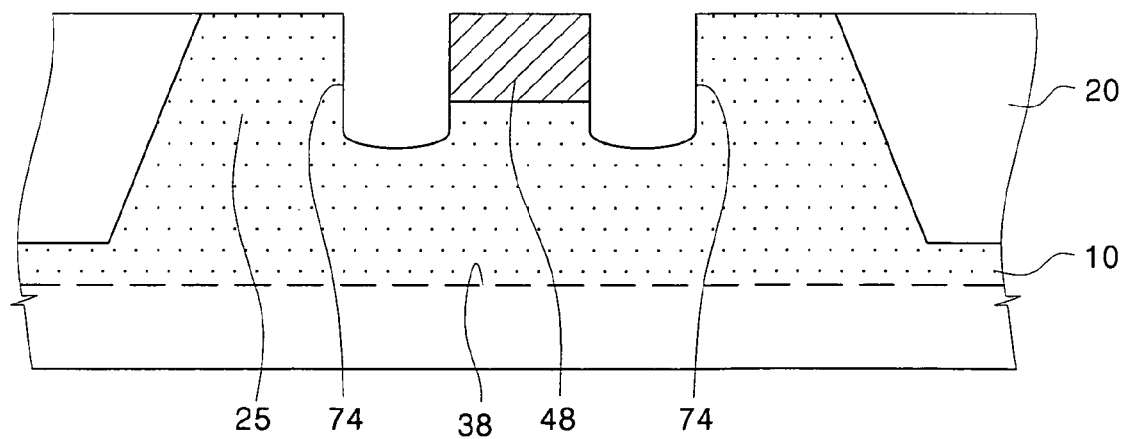

Referring to FIGS. 1, 10, and 11, the mask layer patterns 54 are removed from the semiconductor substrate 10, and a semiconductor thermal oxidation process is performed on the semiconductor substrate having the channel portion holes 74.

The semiconductor thermal oxidation process allows a sacrificial layer 80 to be grown on the semiconductor substrate 10 defining the channel portion holes 74. The sacrificial layer 80 is preferably formed of an insulating material having the same etching ratio as that of the pad layer 30. The sacrificial layer 80 may be formed of a silicon oxide ($SiO_2$) layer. When the pad layer 30 is not formed on the active region 25 of the semiconductor substrate 10, the sacrificial layer 80 is concurrently formed on the main surface of the semiconductor substrate 10 and the semiconductor substrate 10 defining the channel portion holes 74 through the semiconductor thermal oxidation process. In this case, the sacrificial layer 80 includes etching damages around the semiconductor substrate 10 defining the channel portion holes 74 due to the etching process 69 through the semiconductor thermal oxidation process.

A wet etching process is performed on the semiconductor substrate having the sacrificial layer 80 to remove the pad layer 30 and the sacrificial layer 80 from the semiconductor substrate 10. When the pad layer 30 is not formed on the active region 25 of the semiconductor substrate 10, the wet etching process may remove the sacrificial layer 80 from the semiconductor substrate 10. As a result, the channel portion holes 74 and the channel region 48 between the channel portion holes 74 are formed in the semiconductor substrate 10 of the active region 25, which has been isolated by the device isolation layer 20. In this case, by adjusting process conditions of the RTP, the channel region 48 may extend downward from the main surface of the semiconductor substrate 10 more deeply than the channel portion holes 74.

FIGS. 12 to 18 are cross-sectional diagrams illustrating a method of forming the transistor of FIG. 1 according to some other embodiments of the invention. FIGS. 12-18 are taken along the line I-I' of FIG. 1 and are helpful in illustrating the formation of a channel region and channel portion holes.

Figure 12:
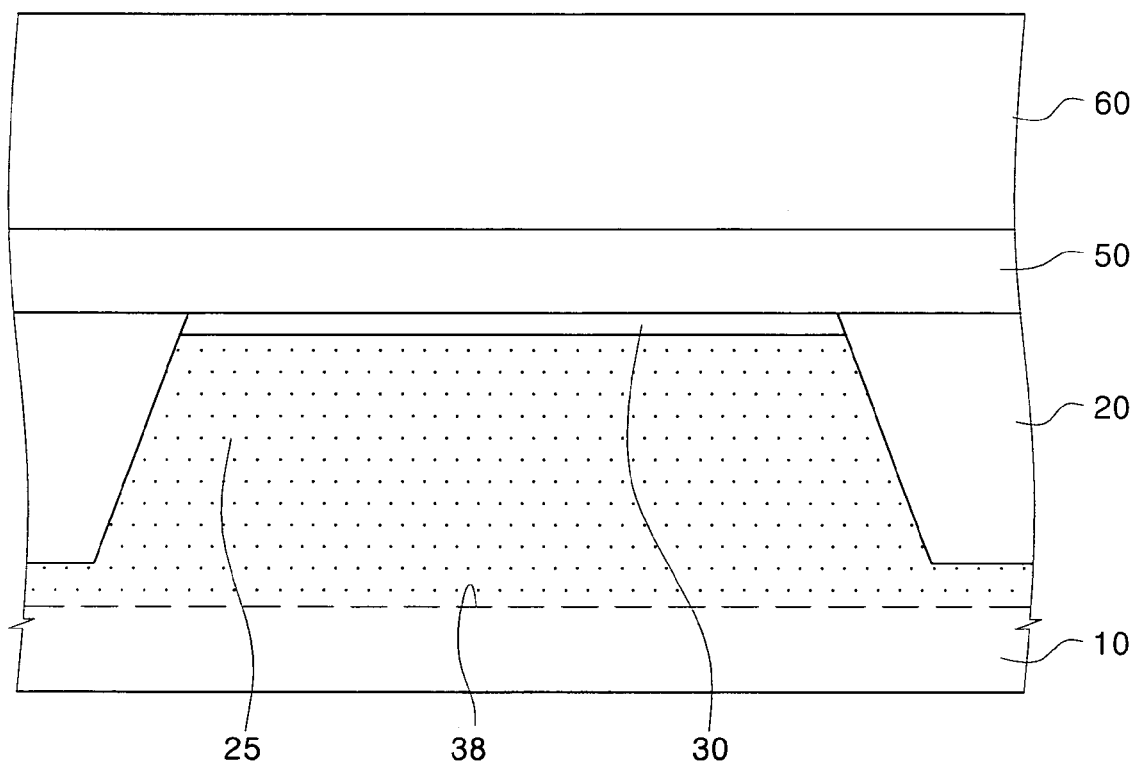
FIGS. 12 to 18 are cross-sectional diagrams illustrating a method of forming the transistor of FIG. 1 according to some other embodiments of the invention.
Figure 13:
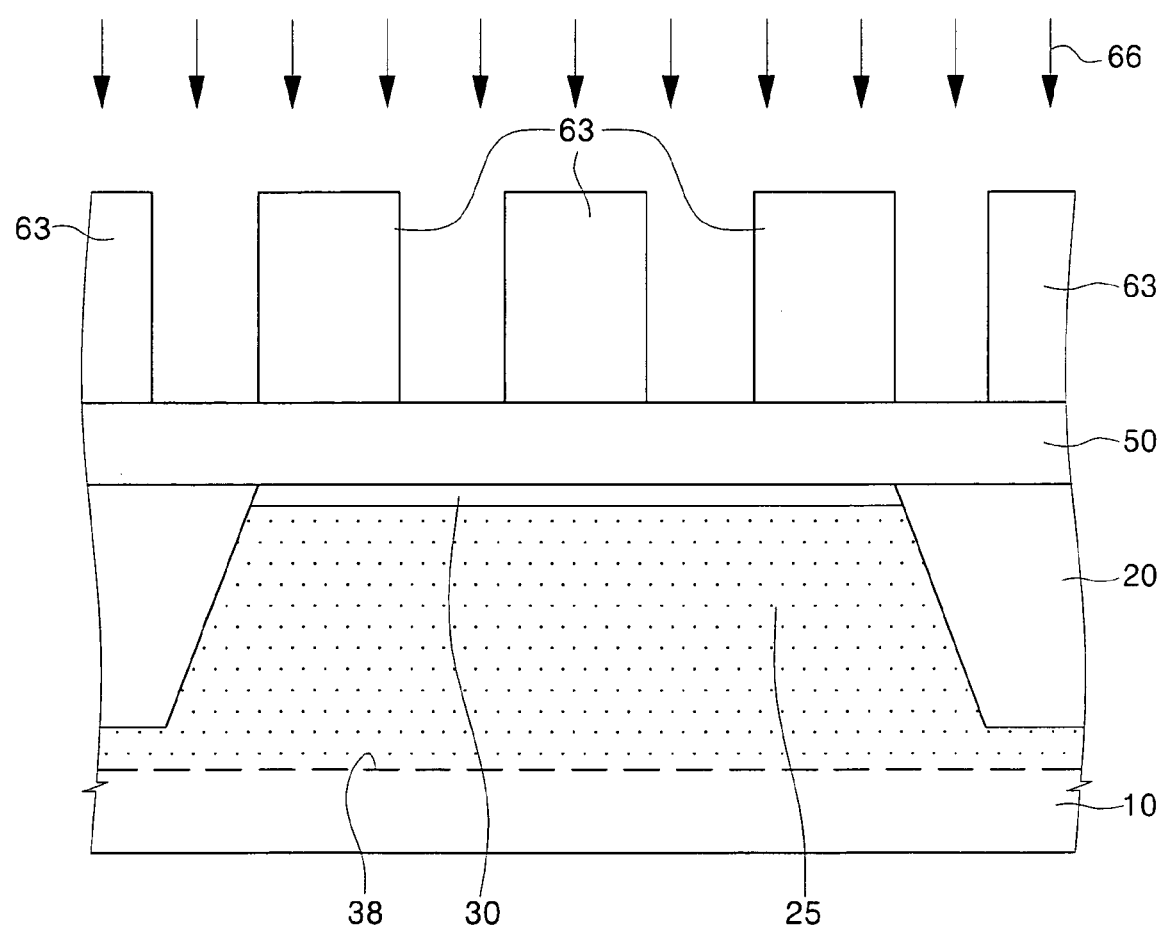

Referring to FIGS. 1 and 12, a device isolation layer 20 is formed in a semiconductor substrate 10 to define at least one active region 25. A pad layer 30 is formed on the semiconductor substrate having the active region 25. The pad layer 30 is formed of an insulating material, for example, a silicon oxide ($SiO_2$), which has an etching ratio different from that of the device isolation layer 20. The pad layer 30 is preferably formed in a dry atmosphere ($O_2$) by using a semiconductor thermal oxidation process. The pad layer 30 may also be formed in a wet atmosphere ($H_2O$) by using a semiconductor thermal oxidation process. In this case, the pad layer 30 is grown in the active region 25 of the semiconductor substrate 10 to have a predetermined thickness. Alternatively, the pad layer 30 may not be formed in the semiconductor substrate 10 of the active region 25.

Figure 2:
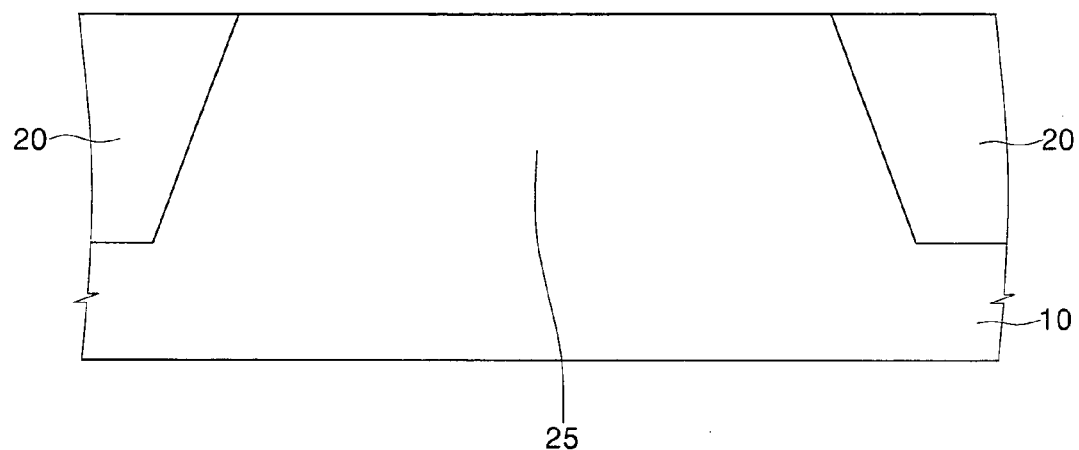
FIGS. 2 to 11 are cross-sectional diagrams illustrating a method of forming the transistor of FIG. 1 according to some embodiments of the invention.
Figure 3:
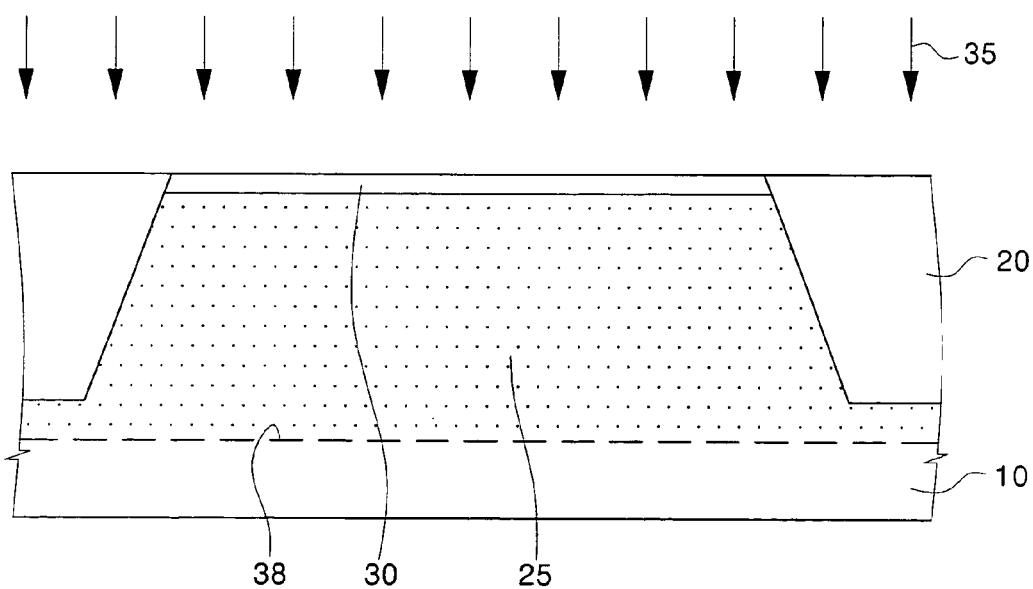
Figure 4:
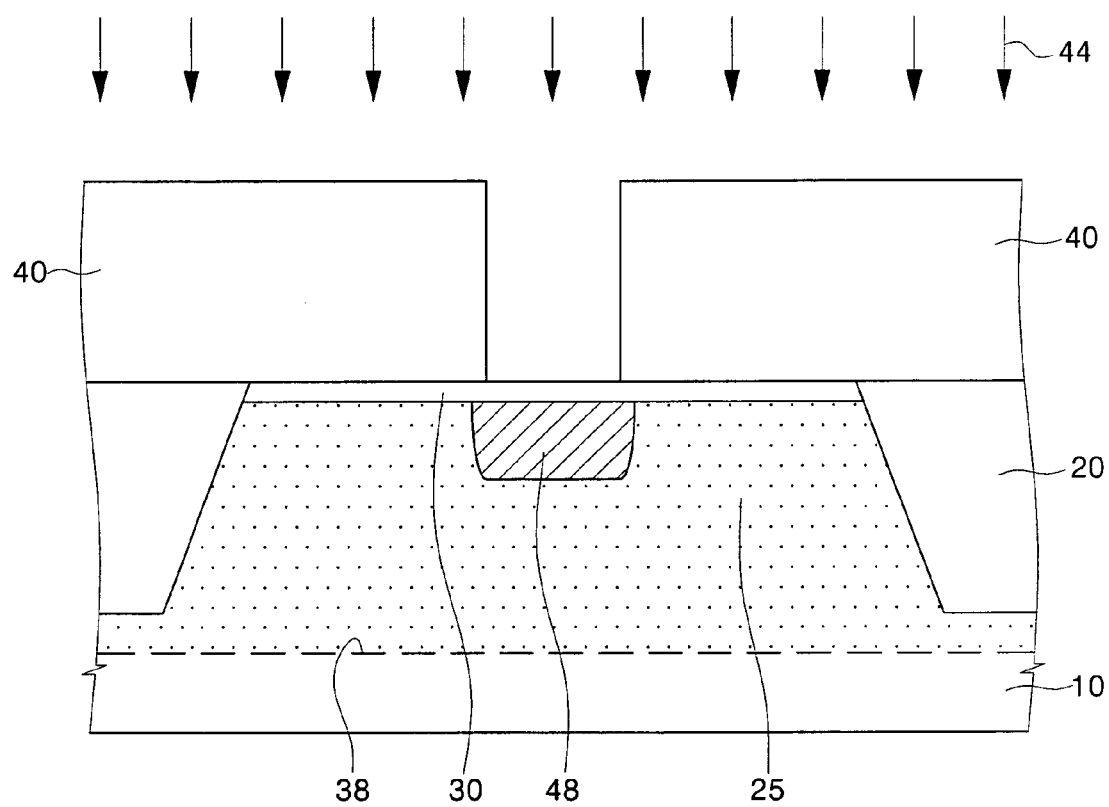
Figure 5:
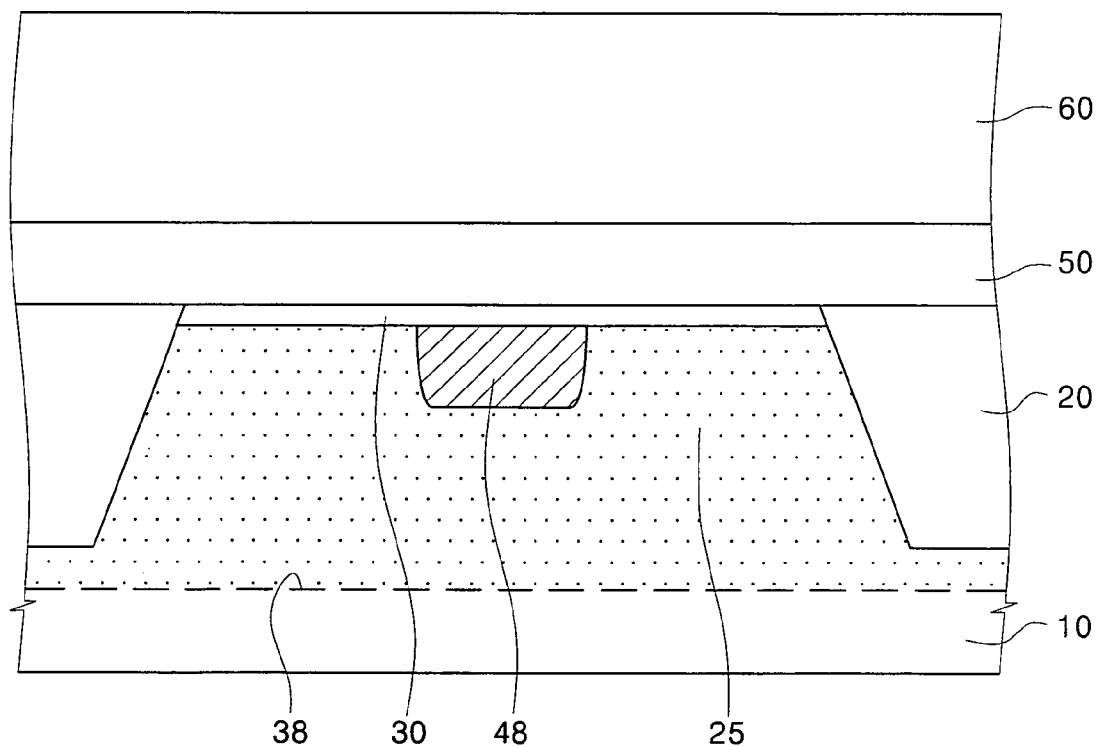
Figure 6:
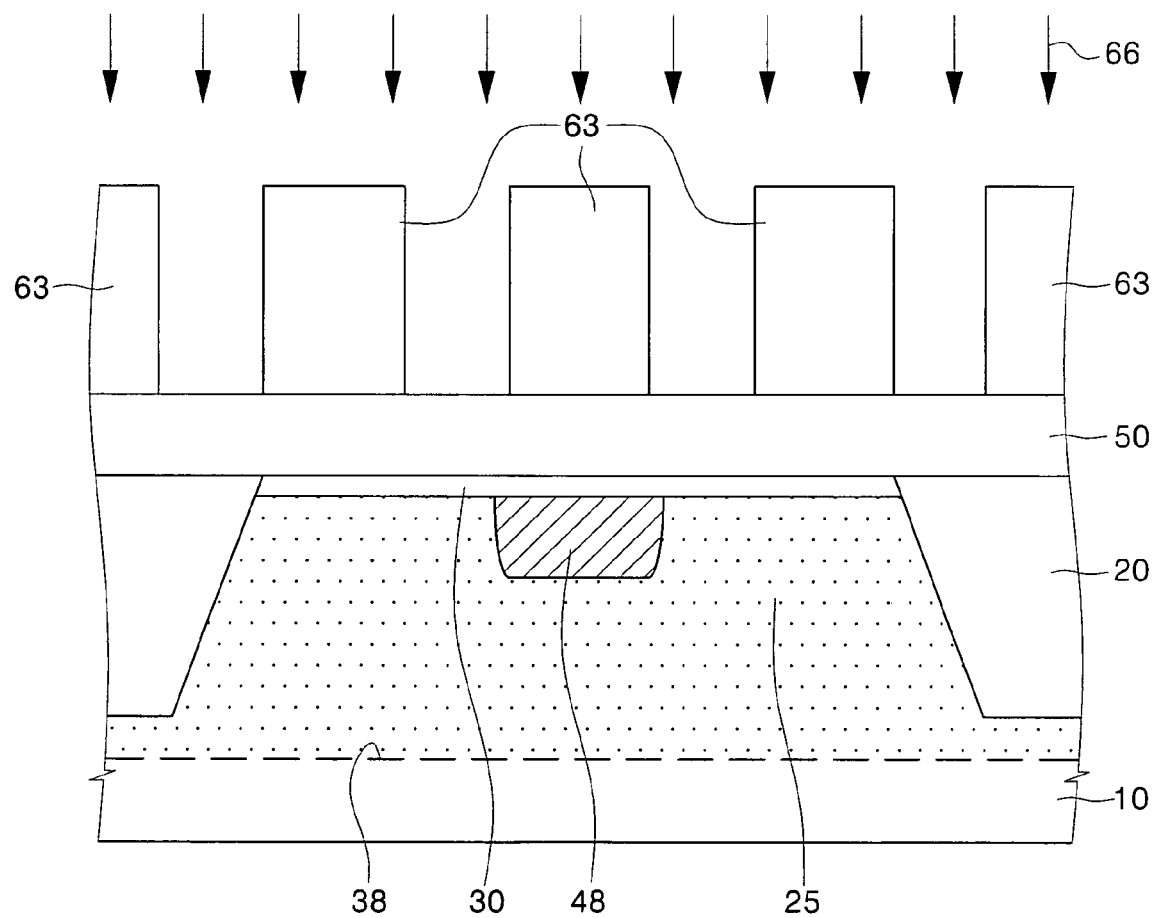

An ion implantation process 35 of FIG. 2 is performed on a surface of the semiconductor substrate having the pad layer 30. The ion implantation process 35 is performed by using the device isolation layer 20 as a mask to implant a dopant material into the semiconductor substrate 10. The dopant material is preferably formed by using P-type impurity ions. Accordingly, the ion implantation process 35 may be performed with boron ions having a dose of about $1.0 \times 10^{13}$ to $4.0 \times 10^{13}$ ions/$cm^2$ and an energy of about 300 to 600 KeV. At this time, when the active region 25 is the DRAM cell 160 of FIG. 1, the ion implantation process 35 uses P-type impurity ions to form a P-type well region 38 in the semiconductor substrate 10. Alternatively, when the active region 25 is not the DRAM cell 160, the ion implantation process 35 may use P-type or N-type impurity ions to form a P-type or N-type well region in the semiconductor substrate 10. The N-type impurity ions may consist of phosphorus (P) ions having a dose of about $1.0 \times 10^{13}$ to $5.0 \times 10^{13}$ ions/$cm^2$ and an energy of about 500 to 900 KeV.

Subsequently, a mask layer 50 and photoresist layer 60 are sequentially formed on the semiconductor substrate having the P-type well region 38. The mask layer 50 preferably consists of an insulating material having an etching ratio different from that of the pad layer 30. For example, the mask layer 50 may be composed of silicon nitride ($Si_3N_4$). Preferably, the insulating material of the mask layer 50 also has an etching ratio that is different from that of the semiconductor substrate 10.

Referring to FIGS. 1 and 13-16, a photolithography process is performed on the photoresist layer 60 to form photoresist patterns 63 on the mask layer 50. An etching process 66 is performed on the mask layer 50 by using the photoresist patterns 63 as an etching mask to expose the device isolation layer 20 and the pad layer 30. The etching process 66 forms mask layer patterns 54 on the device isolation layer 20 and the pad layer 30. In the case that the pad layer 30 is not formed on the active region 25 of the semiconductor substrate 10, the etching process 66 may form the mask layer patterns 54 on the active region 25 of the semiconductor substrate 10 and the device isolation layer 20.

At this time, when the active region 25 is the DRAM cell 160 of FIG. 1, the etching process 66 preferably allows the mask layer patterns 54 that are formed between the first and second word lines 122 and 124 to be parallel to the first and second word lines. Alternatively, when the active region 25 is not the DRAM cell 160, the etching process 66 may allow the mask layer patterns 54 that are formed between the gate patterns to be parallel to the gate patterns. After forming the mask layer patterns 54, the photoresist patterns 63 are removed from the semiconductor substrate 10.

Figure 14:
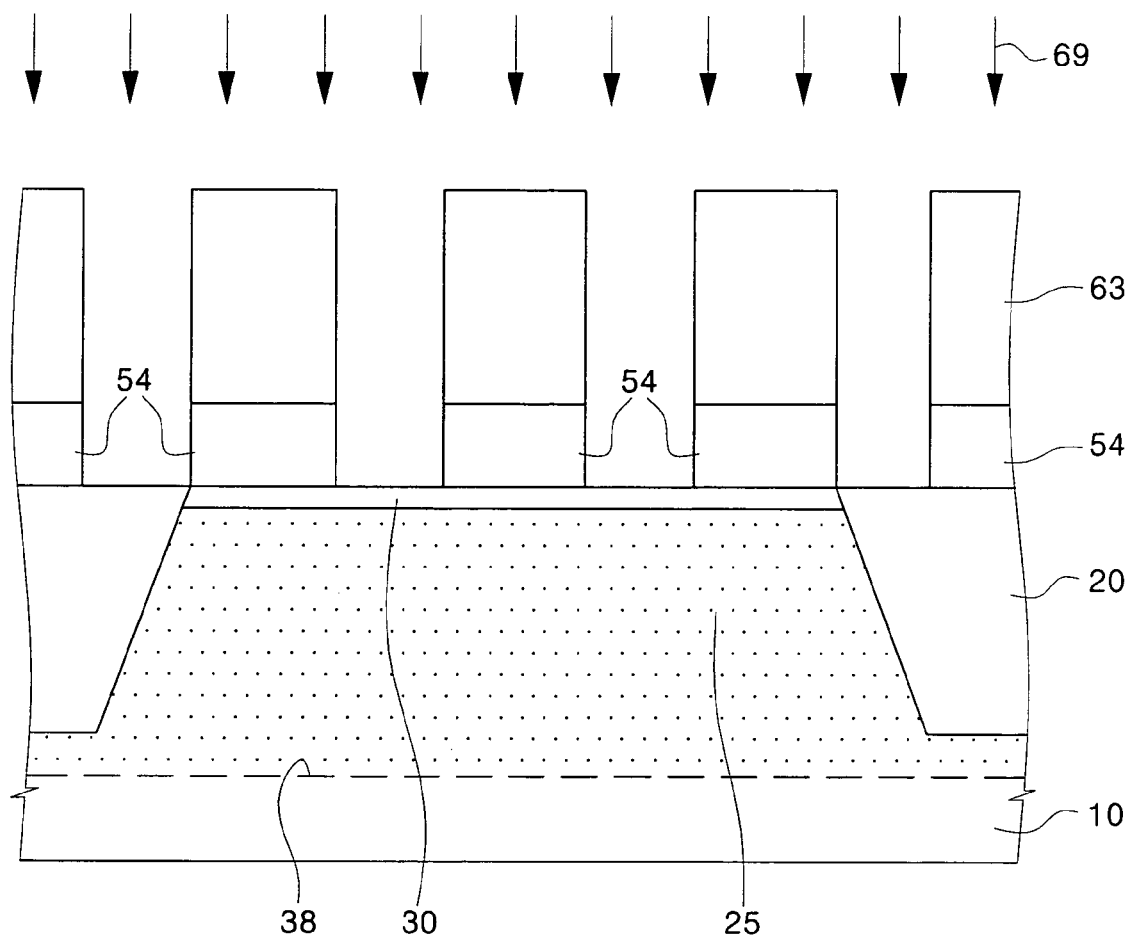

Referring to FIG. 14, an etching process 69 is performed on the pad layer 30 and the semiconductor substrate 10 by using the device isolation layer 20 together with the photoresist patterns 63 and the mask layer patterns 54 as an etching mask. The etching process 69 penetrates the pad layer 30 to form channel portion holes 74 in the active region 25 of the semiconductor substrate 10. If the pad layer 30 is not formed on the active region 25 of the semiconductor substrate 10, the etching process 69 may be performed on the semiconductor substrate 10 of the active region 25 by using the device isolation layer 20 together with the photoresist patterns 63 and the mask layer patterns 54 as an etching mask.

Figure 15:
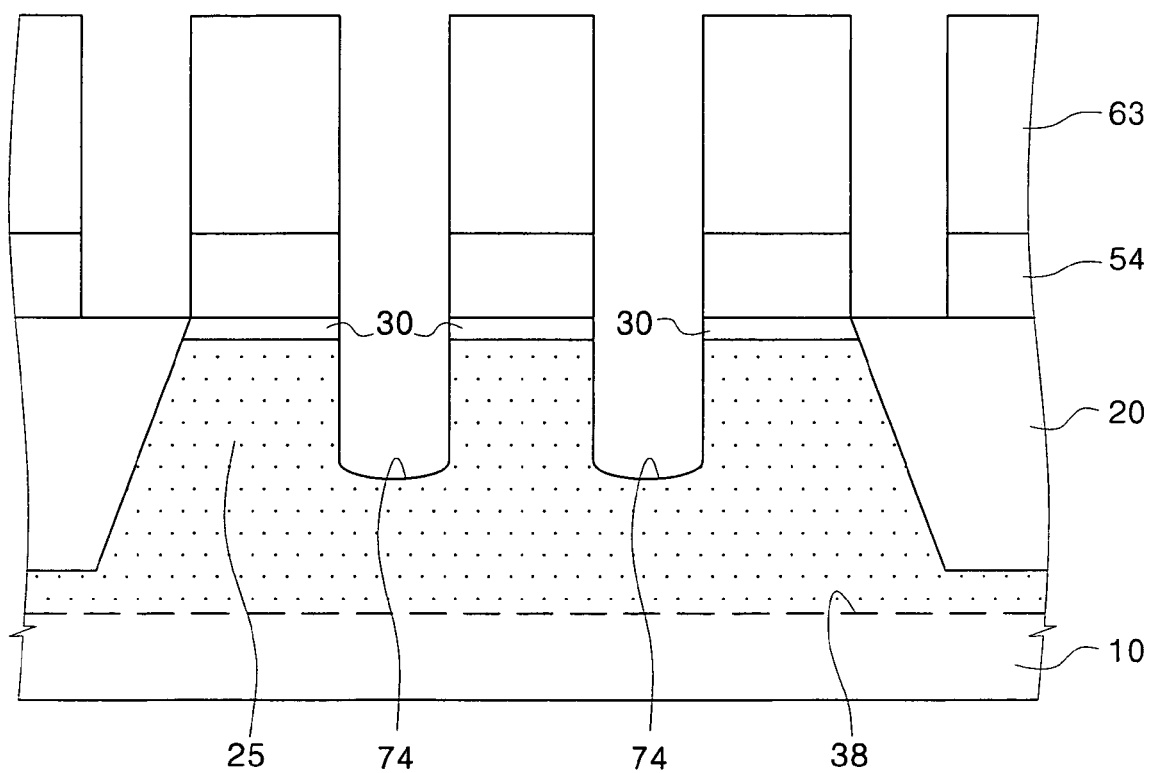

At this time, when the active region 25 is the DRAM cell 160 of FIG. 1, the etching process 69 is performed on the active region 25 to form two channel portion holes 74 as shown in FIG. 15. That is, the channel portion holes 74 are spaced apart from each other, and extend downward from the main surface of the semiconductor substrate 10. Alternatively, when the active region 25 is not the DRAM cell 160, the etching process 69 may be performed on the active region 25 to form at least two channel portion holes 74. The channel portion holes 74 are spaced apart from each other, and extend downward from the main surface of the semiconductor substrate 10. After forming the channel portion holes 74, the photoresist patterns 63 are removed from the semiconductor substrate 10.

Figure 16:
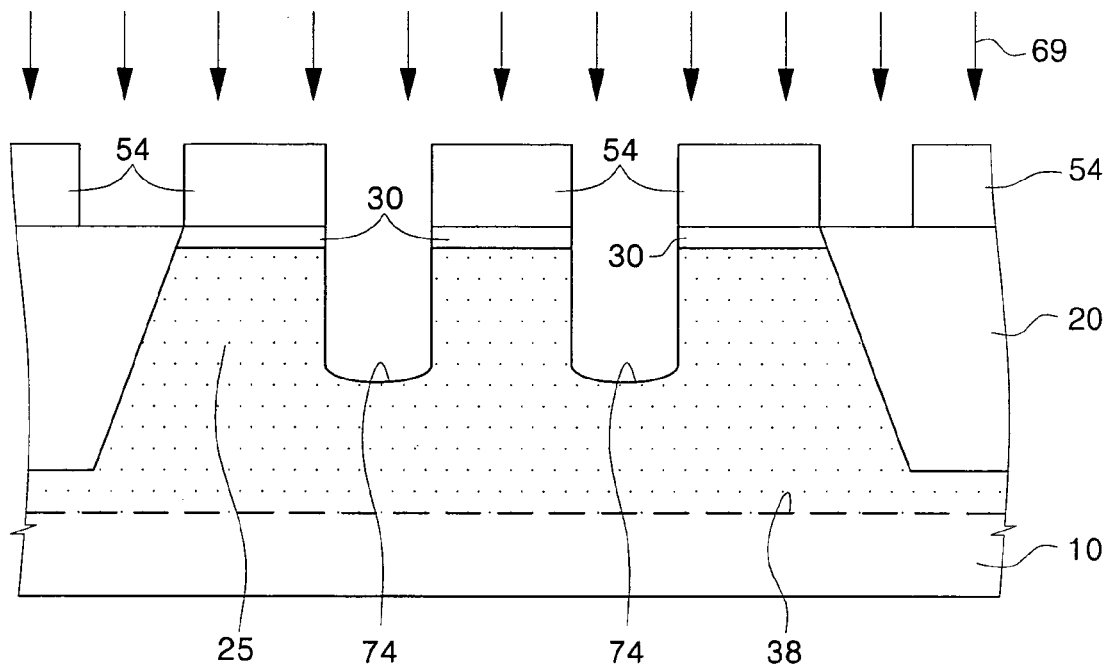

On the other hand, the photoresist patterns 63 may be removed before forming the channel portion holes 74 in the semiconductor substrate 10. At this time, the etching process 69 may be performed on the semiconductor substrate 10 and the pad layer 30 by using the mask layer patterns 54 and the device isolation layer 20 as an etching mask. The etching process 69 penetrates the pad layer 30 to form the channel portion holes 74 in the semiconductor substrate 10 as shown in FIG. 16.

Figure 17:
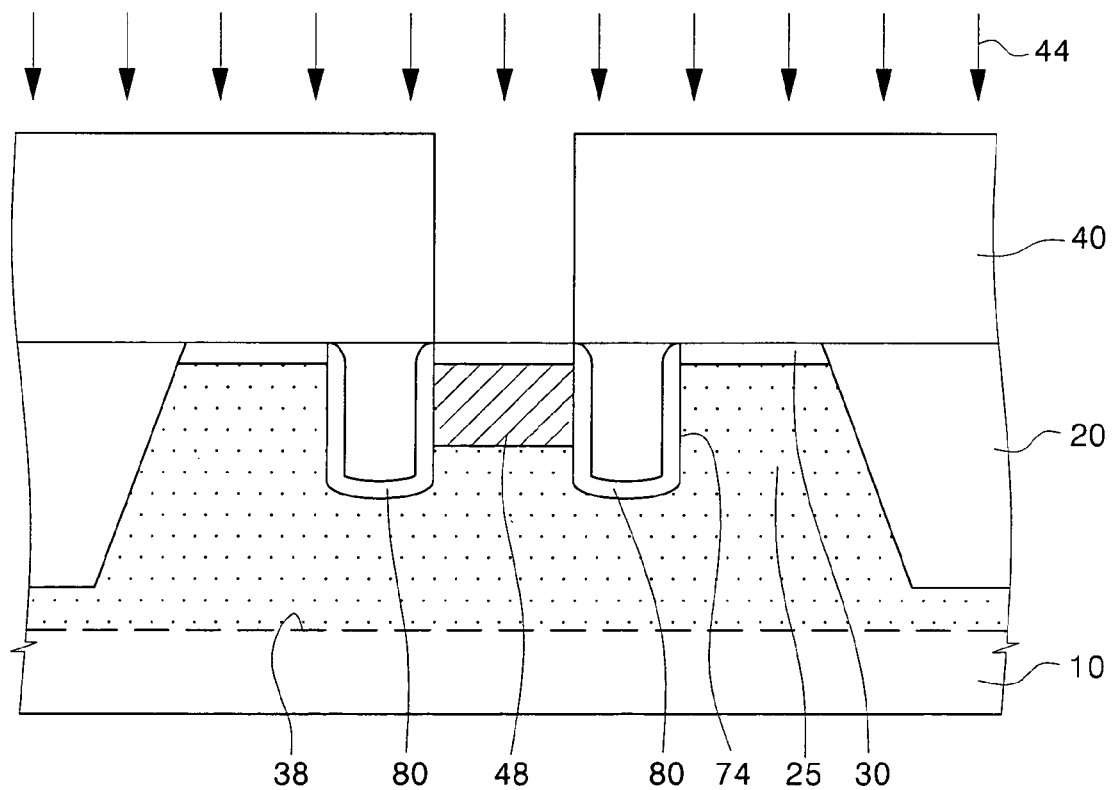
Figure 18:
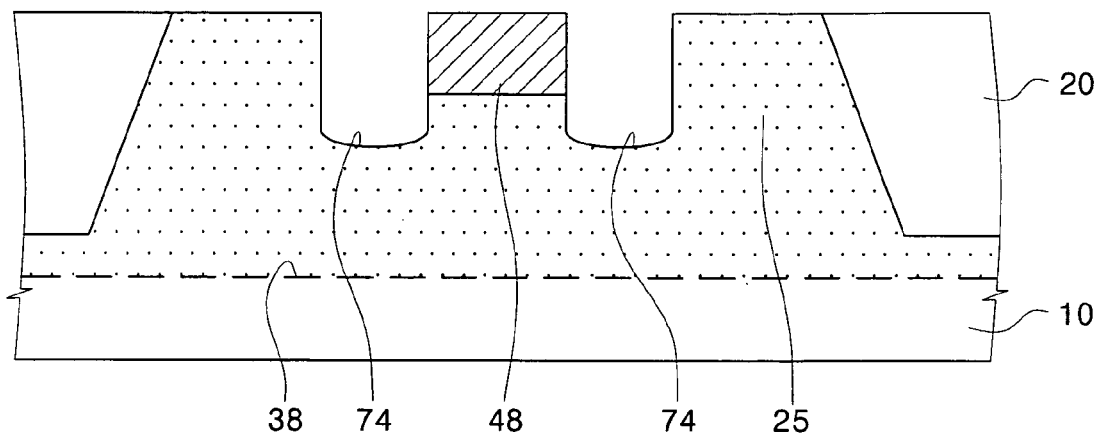

Referring to FIGS. 1, 17, and 18, a semiconductor thermal oxidation process is performed on the semiconductor substrate having the channel portion holes 74 by using the mask layer patterns 54 as a buffer layer. The semiconductor thermal oxidation process grows a sacrificial layer 80 within the channel portion holes 74. The sacrificial layer 80 is preferably formed of an insulating material having the same etching ratio as that of the pad layer 30. The sacrificial layer 80 is preferably formed of a silicon oxide ($SiO_2$). At this time, the sacrificial layer 80 includes etching damages from the etching process 69 through the semiconductor thermal oxidation process. After forming the sacrificial layer 80, the mask layer patterns 54 are removed from the semiconductor substrate 10. If the semiconductor thermal oxidation process is not performed, an insulating layer including a medium temperature oxide (MTO) or a tetraethyl oethosilicate (TEOS) may be formed to cover the semiconductor substrate having the channel portion holes 74.

Photoresist patterns 40 are formed on the semiconductor substrate having the sacrificial layer 80. The photoresist patterns 40 are formed to expose the pad layer 30 between the channel portion holes 74. In the case that the semiconductor substrate 10 of the active region 25 does not have the pad layer 30, the photoresist patterns 40 may be formed to expose the active region 25 of the semiconductor substrate 10 between the channel portion holes 74. In addition, if the insulating layer including the MTO or the TEOS is used to cover the semiconductor substrate having the channel portion holes 74, the photoresist patterns 40 may expose the insulating layer between the channel portion holes 74.

An ion implantation process 44 is performed on the semiconductor substrate 10 by using the photoresist patterns 40 as a mask, and a dopant material is implanted into the semiconductor substrate 10 between the photoresist patterns 40 through the ion implantation process 44. The dopant material preferably consists of P-type impurity ions. Accordingly, the ion implantation process 44 may be performed with boron ions having an energy of about 30 to 50 KeV and a dose of about $1.0 \times 10^{13}$ to $2.0 \times 10^{13}$ ions/cm². The ion implantation process 44 may also be performed with $BF_2$ ions having an energy of about 20 to 50 KeV and a dose of about $0.5 \times 10^{13}$ to $1.0 \times 10^{13}$ ions/cm² together with boron ions having an energy of about 30 to 50 KeV and a dose of about $0.5 \times 10^{13}$ to $1.5 \times 10^{13}$ ions/cm².

At this time, when the active region 25 is the DRAM cell 160 of FIG. 1, the ion implantation process 44 uses P-type impurity ions to form a P-type channel region 48 in the active region 25 of the semiconductor substrate 10. Alternatively, when the active region 25 is not the DRAM cell 160, the ion implantation process 44 may use P-type or N-type impurity ions to form a P-type or N-type channel region in the active region 25 of the semiconductor substrate 10. The N-type channel region is formed by using P or As ions having the same energy and dose as described above. The channel region 48 is preferably disposed between the channel portion holes 74.

After forming the channel region 48, the photoresist patterns 40 are removed from the semiconductor substrate 10. A RTP is then performed on the semiconductor substrate having the well region 38 and the channel region 48 to activate the impurity ions. The RTP may be performed after the formation of the well region 38, and may be performed again after the formation of the channel region 48.

At this time, the channel region 48 may extend downward from the main surface of the semiconductor substrate 10 of the active region 25 to be deeply formed more than depths of the channel portion holes 74 by adjusting process conditions of the RTP.

A wet etching process is performed on the semiconductor substrate having the channel region 48 to remove the pad layer 30 and the sacrificial layer 80 from the semiconductor substrate 10. As a result, the channel portion holes 74 and the channel region 48 disposed between the channel portion holes 74 are formed in the semiconductor substrate 10 of the active region 25, which has been isolated by the device isolation layer 20. If the pad layer 30 is not formed on the active region 25 of the semiconductor substrate 10, the wet etching process may remove the sacrificial layer 80 from the semiconductor substrate 10. In addition, when an insulating layer including the MTO or TEOS is used instead of the sacrificial layer 80, the wet etching process may concurrently remove the pad layer 30 and the insulating layer from the semiconductor substrate 10.

FIGS. 19 to 23 are cross-sectional diagrams illustrating a method of forming the transistor of FIG. 1 according to still other embodiments of the invention. FIGS. 19-23 are taken along the line I-I' of FIG. 1.

Figure 19:
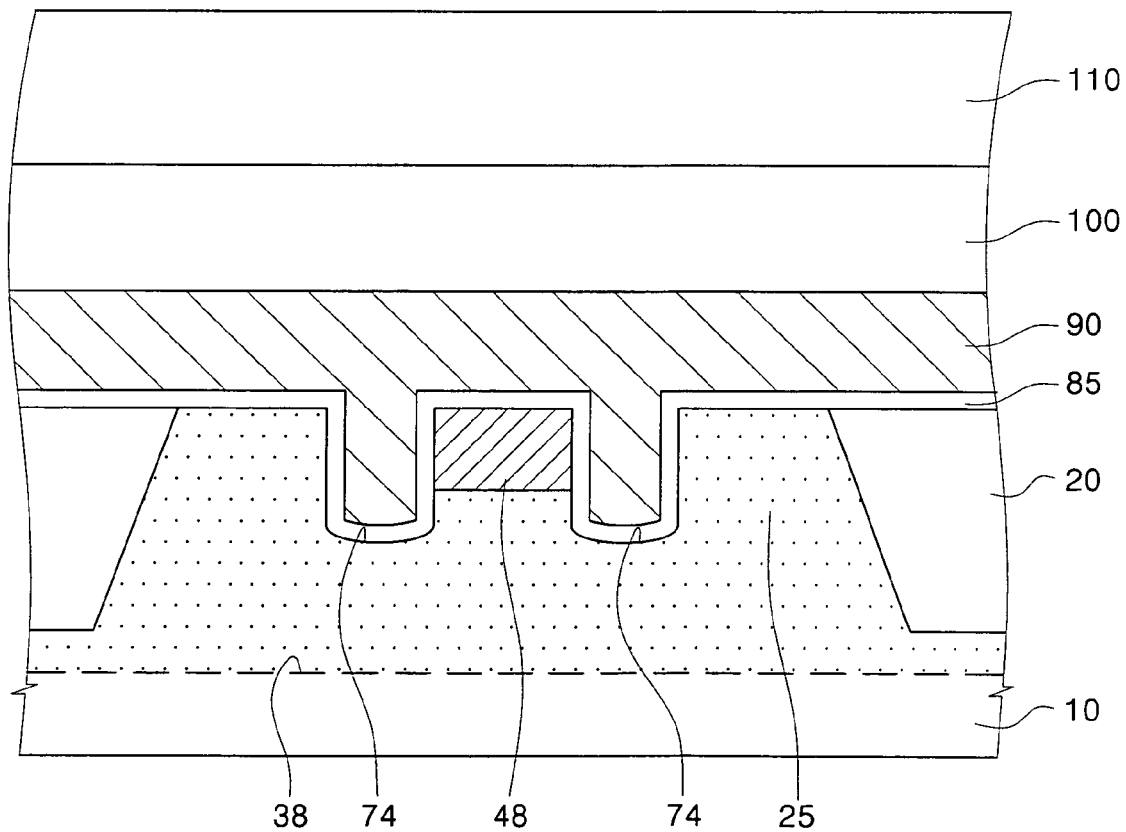
FIGS. 19 to 23 are cross-sectional diagrams illustrating a method of forming the transistor of FIG. 1 according to still other embodiments of the invention.
Figure 20:
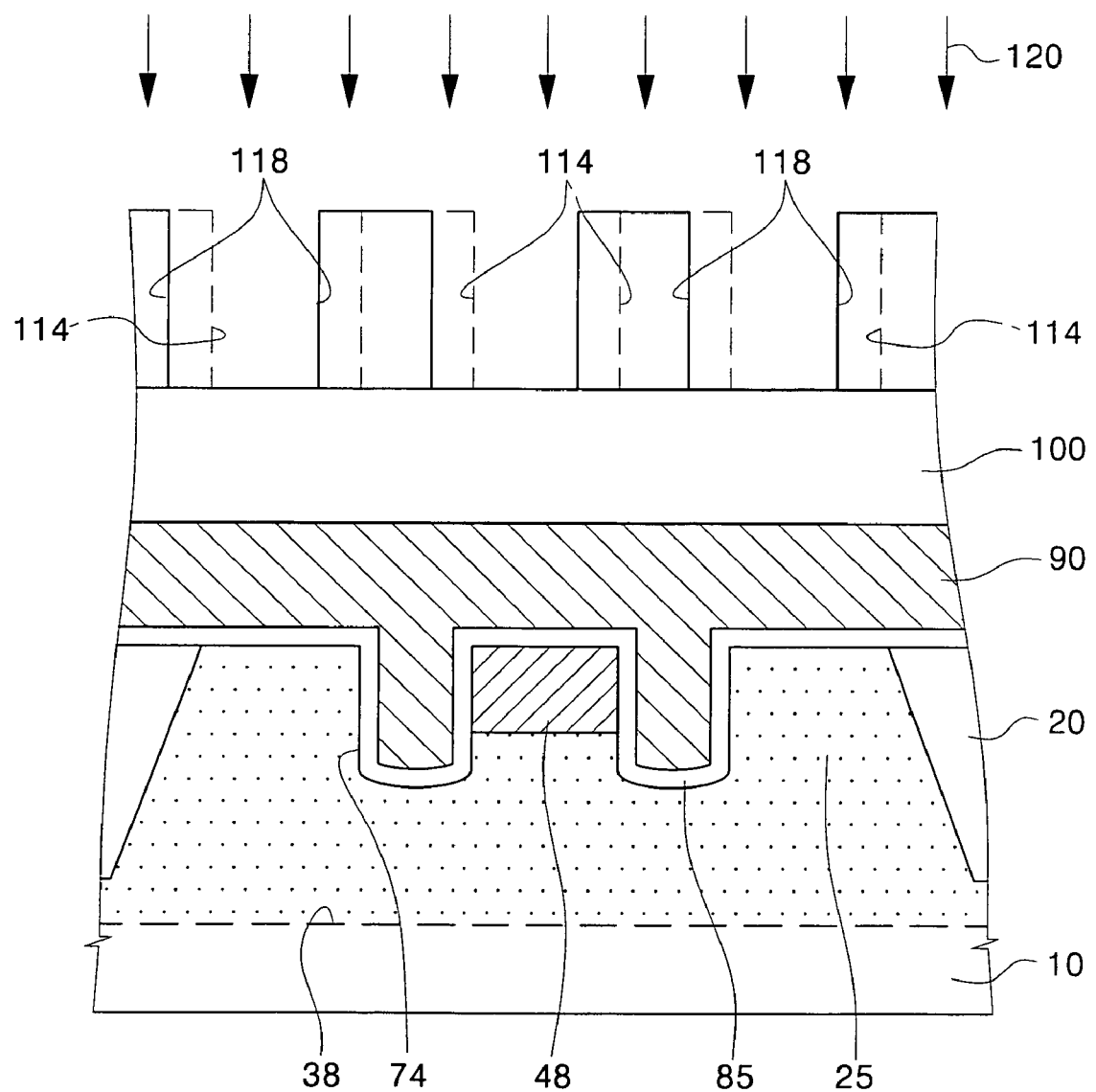

Referring to FIGS. 1, 19, and 20, a semiconductor thermal oxidation process is performed on the semiconductor substrate having the channel region 48 and the channel portion holes 74. The semiconductor thermal oxidation process conformally forms a gate layer 85 on the semiconductor substrate 10 defining the channel portion holes 74 and on the main surface of the semiconductor substrate 10. The gate layer 85 is formed of an insulating material having an etching ratio different from that of the device isolation layer 20, for example, $SiO_2$. The gate layer 85 is preferably formed in a dry atmosphere ($O_2$) by using the semiconductor thermal oxidation process. The gate layer 85 may be formed in a wet atmosphere ($H_2O$) by using the semiconductor thermal oxidation process.

A gate conductive layer 90 and a gate capping layer 100 are sequentially formed on the semiconductor substrate having the gate layer 85, and a photoresist layer 110 is then formed on the gate capping layer 100. The gate conductive layer 90 may be formed of an N+ type doped polysilicon or of an N+ type doped polysilicon and a tungsten silicide (WSi) stacked thereon. The gate capping layer 100 is preferably formed of an insulating material having an etching ratio different from that of the gate layer 85. The gate capping layer 100 may be formed of a silicon nitride ($Si_3N_4$).

A photolithography process is performed on the photoresist layer 110 to form photoresist patterns 114 or 118 on the gate capping layer 100. At this time, when the active region 25 is the DRAM cell 160 of FIG. 1, the photoresist patterns 114 are centered above the two channel portion holes 74. Alternatively, when the active region 25 is not the DRAM cell 160, the photoresist patterns 114 are preferably centered above at least two channel portion holes 74. Thus, the photoresist patterns 114 have a good alignment with the channel portion holes 74 throughout the photolithography process.

However, during the performance of the photolithography process, unstable process conditions may exist, forming other photoresist patterns 118 on the gate capping layer 100. The other photoresist patterns 118 do not have a good alignment with respect to the channel portion holes 74. As shown in FIG. 20, the other photoresist patterns 118 overlap only a portion of the channel portion holes 74.

Figure 21:
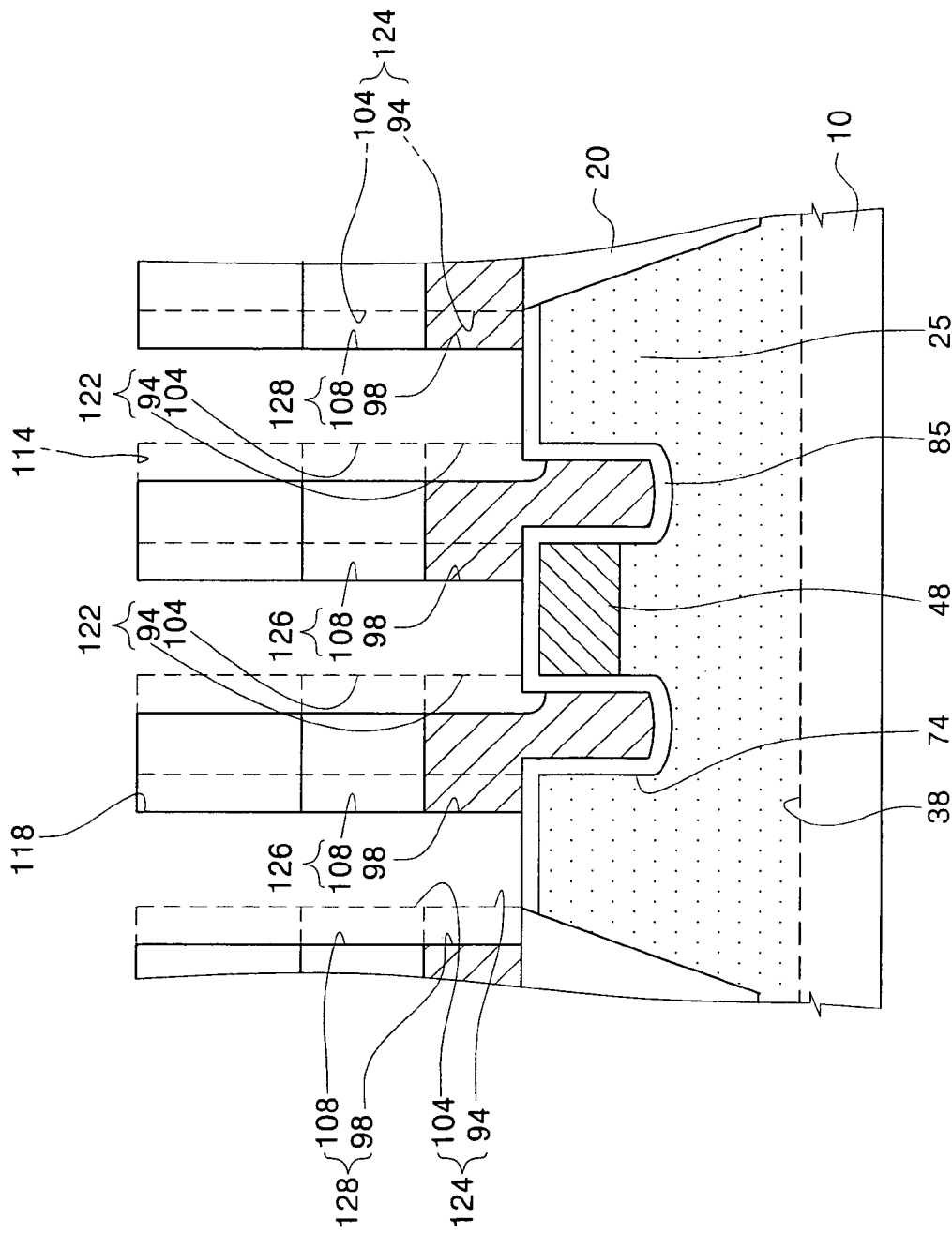

Referring to FIGS. 1 and 21, an etching process 120 is sequentially performed on the gate capping layer 100 and the gate conductive layer 90 by using the photoresist patterns 114 as an etching mask. The etching process 120 exposes the gate layer 85. At this time, when the active region 25 is the DRAM cell 160 of FIG. 1, the etching process 120 forms first word line patterns 122 and second word line patterns 124 on the gate layer 85 and the device isolation layer 20, respectively. The first word line patterns 122 are formed to fill the channel portion holes 74 and to cross the active region 25. The second word line patterns 124 are formed at an opposite side of at least one of the first word line patterns 122. Furthermore, the first and second word line patterns 122 and 124 are preferably formed to extend upward from the semiconductor substrate 10. Each of the first and second word line patterns 122 and 124 is formed by using a word line 94 and a word line capping layer pattern 104 stacked thereon.

Alternatively, when the active region 25 is not the DRAM cell 160, the etching process 120 may form gate patterns on the active region 25 of the semiconductor substrate 10. The gate patterns are formed to fill the channel portion holes 74 and to cross the active region 25. The gate patterns are preferably formed to extend upward from the main surface of the semiconductor substrate 10. Each of the gate patterns is formed by using a gate and a gate capping layer pattern stacked thereon. The gate patterns as well as the first and second word line patterns 122 and 124 have a good alignment with the channel portion holes 74.

The etching process 120 may also be performed on the gate capping layer 100 and the gate conductive layer 90 by using the other photoresist patterns 118 as an etching mask. In this case, the etching process 120 is performed to expose the gate layer 85. At this time, if the active region 25 is the DRAM cell 160 of FIG. 1, the etching process 20 forms other first word line patterns 126 and other second word line patterns 128 on the gate layer 85 and the device isolation layer 20, respectively. The other first word line patterns 126 are formed to fill the channel portion holes 74 and to cross the active region 25. The other second word line patterns 128 are formed at an opposite side of at least one of the other first word line patterns 126. The other first word line patterns 126 do not have a good alignment with respect to the channel portion holes 74, that is, the other first word line patterns 126 partially expose upper portions of the channel portion holes 74. Each of the other first and second word line patterns 126 and 128 are formed by using other word lines 98 and other word line capping layer patterns 108 stacked thereon.

When the active region 25 is not the DRAM cell 160, the etching process 120 may form other gate patterns above the active region 25 of the semiconductor substrate 10. The other gate patterns are formed to fill the channel portion holes 74 and to cross the active region 25. The other gate patterns do not have a good alignment with the channel portion holes 74, that is, the other gate patterns partially expose upper portions of the channel portion holes 74. The other gate patterns are preferably formed to extend upward from the main surface of the semiconductor substrate 10. Furthermore, the other gate patterns are formed by using other gates and other gate capping layer patterns stacked thereon.

The first and second word line patterns 122 and 124, the other first and second word line patterns 126 and 128, the gate patterns, and the other gate patterns do not affect a threshold voltage of a desired transistor even through they do not have a good alignment with the channel portion holes 74, because the channel region 48 between the channel portion holes 74 are not formed in the semiconductor substrate 10 by using the first and second word line patterns 122 and 124, the other first and second word line patterns 126 and 128, the gate patterns, or the other gate patterns as a mask. Accordingly, the threshold voltage of the transistor may be kept constant regardless of the alignment state of the channel portion holes 74 with the first and second word line patterns 122 and 124, the other first and second word line patterns 126 and 128, the gate patterns, or the other gate patterns.

Figure 22:
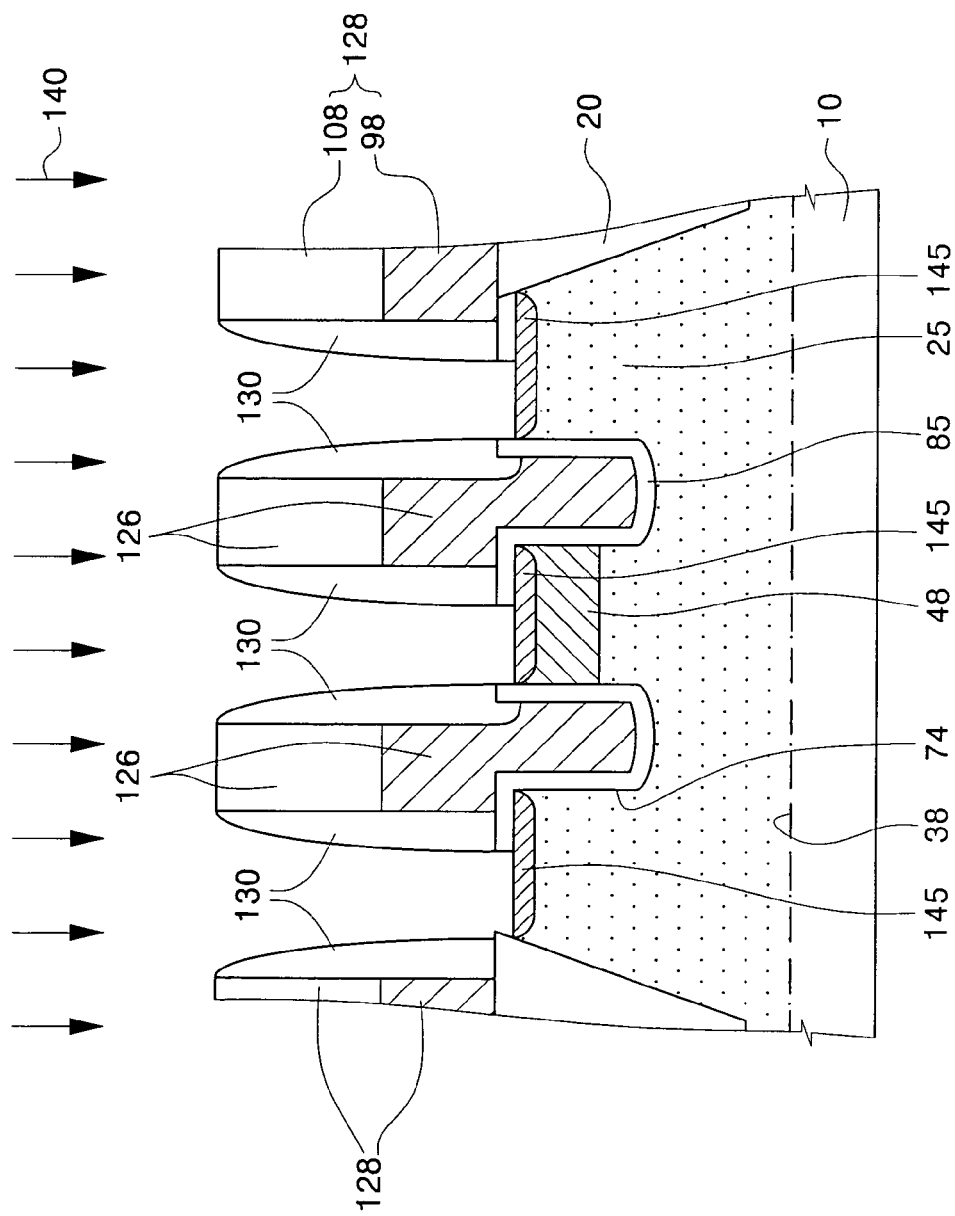
Figure 23:
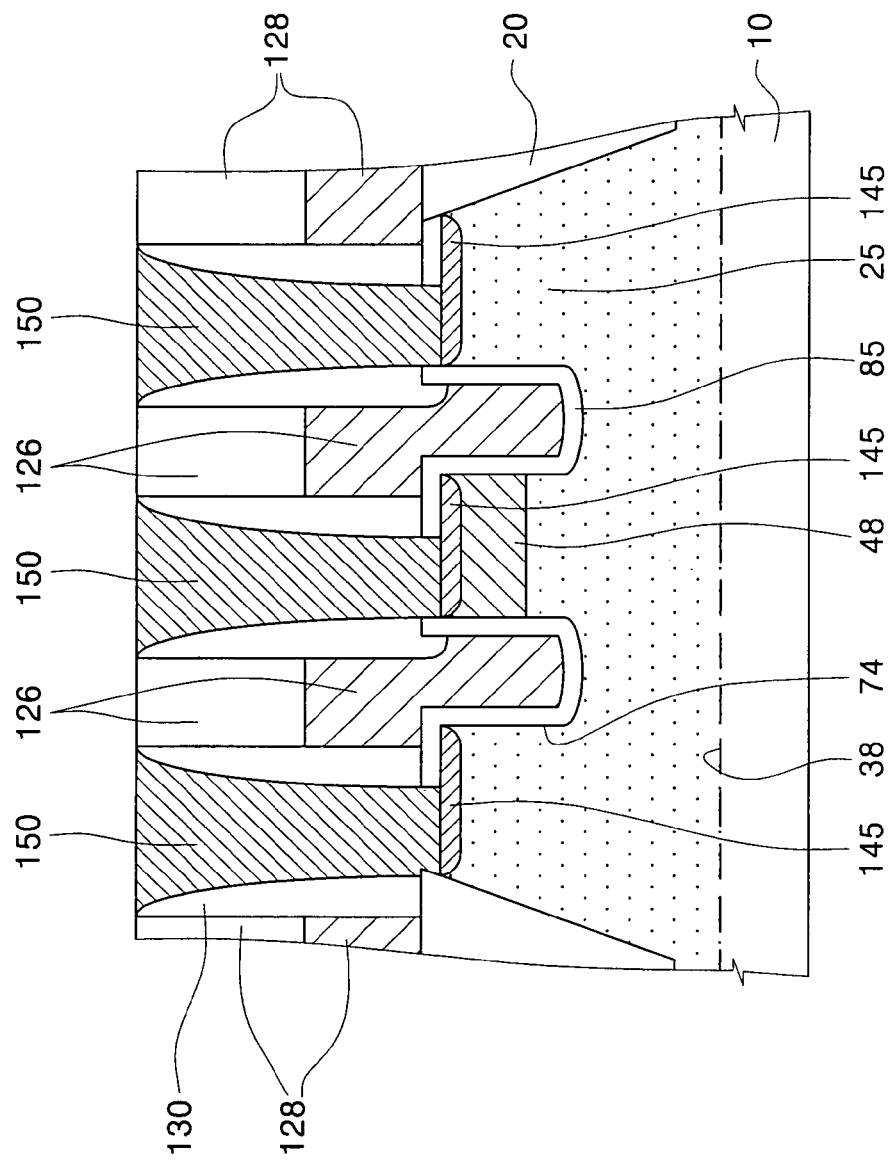

Referring to FIGS. 1, 22, and 23, word line spacers 130 are formed on sidewalls of the other first and second word line patterns 126 and 128. When the active region 25 is not the DRAM cell 160 of FIG. 1, gate spacers may be formed on sidewalls of the gate patterns. The gate spacers and the word line spacers 130 expose the semiconductor substrate 10. The gate spacers and the word line spacers 130 are preferably composed of an insulating material having an etching ratio different from that of the gate layer 85. The word line spacers 130 are preferably composed of an insulating material having the same etching ratio as that of the other word line capping layer patterns 108. The gate spacers are preferably composed of an insulating layer having the same etching ratio as that of the other gate capping layer patterns. The gate spacers and the word line spacers 130 may be composed of a silicon nitride ($Si_3N_4$).

An ion implantation process 140 is performed on the active region 25 of the semiconductor substrate 10 by using the other first and second word line patterns 126 and 128 as a mask. The ion implantation process 140 implants a dopant material into the active region 25 of the semiconductor substrate 10 between the other first and second word line patterns 126 and 128. The dopant material preferably consists of N-type impurity ions. Accordingly, the ion implantation process 140 may be performed with phosphorus (P) ions having an energy of about 10 to 25 KeV and a dose of about $1.0 \times 10^{13}$ to $4.0 \times 10^{13}$ ions/cm$^2$. Alternatively, the ion implantation process 140 may be performed with arsenic (As) ions having an energy of about 15 to 40 KeV and a dose of about $1.0 \times 10^{13}$ to $4.0 \times 10^{13}$ ions/cm$^2$.

At this time, when the active region 25 is the DRAM cell 160 of FIG. 1, the ion implantation process 140 uses N-type impurity ions to form an N-type shallow impurity region 145 in the semiconductor substrate 10. Alternatively, when the active region 25 is not the DRAM cell 160, the ion implantation process 140 may be performed on the active region 25 of the semiconductor substrate 10 by using the other gate patterns as a mask. The ion implantation process 140 implants a dopant material into the active region of the semiconductor substrate 10 between the other gate patterns. The dopant material preferably consists of N-type impurity ions when the semiconductor substrate 10 has a P-type channel region 48. Accordingly, the ion implantation process 140 may be performed with phosphorus (P) ions having an energy of about 10 to 25 KeV and a dose of about $1.0 \times 10^{14}$ to $5.0 \times 10^{14}$ ions/cm$^2$. Alternatively, the ion implantation process 140 may be performed with arsenic (As) ions having an energy of about 15 to 35 KeV and a dose of about $1.0 \times 10^{14}$ to $5.0 \times 10^{14}$ ions/cm$^2$.

The dopant material preferably consists of P-type impurity ions when the semiconductor substrate 10 has an N-type channel region. In this case, the ion implantation process 140 is performed with $BF_2$ ions or B ions having the same energy and dose as described above to thereby form P-type shallow impurity regions. The shallow impurity regions are formed to be in contact with the main surface of the semiconductor substrate 10. The channel region 48 contacts one of the shallow impurity regions 145.

Landing pads 150 are formed between the other first and second word line patterns 126 and 128. The landing pads 150 are isolated from each other by the other first and second word line patterns 126 and 128. The landing pads 150 are disposed in contact with the active region 25 of the semiconductor substrate 10. Preferably, the landing pads 150 are composed of an N+ type doped polysilicon layer. At this time, when the active region 25 is the DRAM cell 160 of FIG. 1, one of the landing pads 150, which is formed above the channel region 48, acts as an electrical node of a bit line and the rest of the landing pads act as electrical nodes of storages. Alternatively, when the active region 25 is not the DRAM cell 160, the landing pads 150 act as electrical nodes of bit lines or electrical nodes of metal interconnection lines.

As described above, embodiments of the invention provide a transistor for a DRAM cell that is capable of maintaining a constant threshold voltage regardless of an alignment state between a channel portion hole and a word line pattern. As such, the transistor of the DRAM cell may show a current drivability which is not affected by the semiconductor fabrication process.

The invention may be practiced in many ways. What follows are exemplary, non-limiting descriptions of some embodiments of the invention.

Embodiments of the invention provide methods of forming a transistor having a channel region at a predetermined sidewall of a channel portion hole.

According to some embodiments of the invention, a method of forming a transistor includes forming a device isolation layer in a semiconductor substrate. The device isolation layer is formed to define at least one active region. A channel region is formed in a predetermined portion of the active region of the semiconductor substrate. Two channel portion holes are formed to extend downward from a main surface of the semiconductor substrate to be in contact with the channel region. Gate patterns fill the channel portion holes while extending upward from the main surface of the semiconductor substrate. The gate patterns are formed to cross the active region. Shallow impurity regions are formed in the active region of the semiconductor substrate between the gate patterns. At this time, the shallow impurity regions are formed to be in contact with the main surface of the semiconductor substrate, and the channel region is formed between the channel portion holes to be in contact with one of the shallow impurity regions.

According to some embodiments of the invention, a method of forming a transistor for a DRAM cell includes forming a device isolation layer in a semiconductor substrate. The device isolation layer is formed to define at least one active region. A channel region is formed in a predetermined portion of the active region of the semiconductor substrate. Two channel portion holes are to extend downward from a main surface of the semiconductor substrate to be in contact with the channel region. First word line patterns are formed on the active region and second word line patterns on the device isolation layer. The second word line patterns are formed at an opposite side of at least one of the first word line patterns while the first word line patterns are formed to fill the channel portion holes. Shallow impurity regions are formed in the active region of the semiconductor substrate between the first and second word line patterns. At this time, the shallow impurity regions are formed to be in contact with the main surface of the semiconductor substrate, and the channel region is formed between the channel portion holes to be in contact with one of the shallow impurity regions while the first and second word line patterns are formed to extend upward from the semiconductor substrate.

According to some embodiments of the invention, a method of forming a transistor includes forming a device isolation layer in a semiconductor substrate. The device isolation layer is formed to define at least one active region. Two channel portion holes are formed in the active region to extend downward from a main surface of the semiconductor substrate. A channel region is formed in the active region of the semiconductor substrate between the channel portion holes. Gate patterns fill the channel portion holes while extending upward from the main surface of the semiconductor substrate. The gate patterns are formed to cross the active region. Shallow impurity regions are formed in the active region of the semiconductor substrate between the gate patterns. At this time, the shallow impurity regions are formed to be in contact with the main surface of the semiconductor substrate, and the channel region is formed to be in contact with the channel portion holes and in contact with one of the shallow impurity regions.

According to some embodiments of the invention, a method of forming a transistor for a DRAM cell includes forming a device isolation layer in a semiconductor substrate. The device isolation layer is formed to define at least one active region. Two channel portion holes are formed in the active region to extend downward from a main surface of the semiconductor substrate. A channel region is formed in the active region of the semiconductor substrate between the channel portion holes. First word line patterns are formed on the active region and second word line patterns on the device isolation layer. The second word line patterns are formed at an opposite side of at least one of the first word line patterns while the first word line patterns are formed to fill the channel portion holes. Shallow impurity regions are formed in the active region of the semiconductor substrate between the first and second word line patterns. At this time, the shallow impurity regions are formed to be in contact with the main surface of the semiconductor substrate, and the channel region is formed between the channel portion holes to be in contact with one of the shallow impurity regions while the first and second word line patterns are formed to extend upward from the semiconductor substrate.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

It will be appreciated by those skilled in the art that changes in these described embodiments of the invention may be made without departing from the principles and spirit of the invention itself, the scope of which is defined by the appended claims.

The invention claimed is:

1. A method comprising:
    forming a device isolation layer on a semiconductor substrate to define at least one active region;
    forming a channel region in a predetermined portion of the at least one active region;
    forming two channel portion holes that extend downward from a main surface of the semiconductor substrate and that have the channel region between the two channel portion holes and contact the channel region through sidewalls of the two channel portion holes;
    forming first gate patterns at the active region such that first gate patterns respectively and sufficiently fill the channel portion holes and extend upward and downward from the main surface of the semiconductor substrate, the first gate patterns crossing the at least one active region;
    forming second gate patterns disposed on the device isolation layer; and
    forming shallow impurity regions in the at least one active region of the semiconductor substrate between the gate patterns, the shallow impurity regions in contact with the main surface of the semiconductor substrate, with one of the shallow impurity regions in contact with the channel region, wherein a lowermost portion of the channel region is above bottom surfaces of the two channel portion holes, and wherein the channel region is only between the first gate patterns.

2. The method of claim 1, wherein forming the channel region includes:

exposing the predetermined portion of the at least one active region with a photoresist pattern; and implanting a dopant material into the predetermined portion of the at least one active region using the photoresist pattern as a mask.

3. The method of claim 2, wherein implanting the dopant material comprises implanting P-type impurity ions.

4. The method of claim 1, wherein forming two channel portion holes comprises:

forming a mask layer over the channel region;

forming photoresist patterns on the mask layer;

using the photoresist patterns as an etching mask, etching the mask layer to form mask layer patterns, the mask layer patterns disposed between the gate patterns and parallel to the gate patterns, one of the mask layer patterns overlapping the channel region;

using the device isolation layer together with the photoresist patterns and the mask layer patterns as an etching mask, etching the semiconductor substrate; and removing the photoresist patterns from the semiconductor substrate.

5. The method of claim 4, wherein forming the mask layer comprises forming the mask layer of an insulating material having an etching ratio that is different from that of the semiconductor substrate.

6. The method of claim 1, wherein forming two channel portion holes comprises:

forming a mask layer over the semiconductor substrate;

forming photoresist patterns on the mask layer;

using the photoresist patterns as an etching mask, etching the mask layer to form mask layer patterns, the mask layer patterns disposed between the gate patterns and parallel to the gate patterns, one of the mask layer patterns overlapping the channel region;

removing the photoresist patterns from the semiconductor substrate; and using the device isolation layer and the mask layer patterns as an etching mask, etching the semiconductor substrate.

7. The method of claim 6, wherein forming the mask layer comprises forming the mask layer of an insulating material having an etching ratio different from that of the semiconductor substrate.

8. The method of claim 1, wherein forming gate patterns comprises:

forming a gate conductive layer on the main surface of the semiconductor substrate and in the two channel portion holes;

forming a gate capping layer on the gate conductive layer; and patterning gate conductive layer and the gate capping layer.

9. The method of claim 1, wherein forming shallow impurity regions comprises forming shallow impurity regions with N-type impurity ions.

10. A method of forming a dynamic random access memory (DRAM) cell transistor, the method comprising:

forming a device isolation layer in a semiconductor substrate to define at least one active region;

forming a channel region in a portion of the at least one active region;

forming two channel portion holes that extend downward from a main surface of the semiconductor substrate to have the channel region between the two channel portion holes and contact the channel region through sidewalls of the two channel portion holes;

concurrently forming first word line patterns at the active region that cross the at least one active region and second word line patterns on the device isolation layer, the first and second word line patterns extending upwards from the main surface of the semiconductor substrate, the first word line patterns filling the channel portion holes and extending downwards from the main surface of the semiconductor substrate; and forming shallow impurity regions in the at least one active region between the first and second word line patterns, the shallow impurity regions in contact with the main surface of the semiconductor substrate, one of the shallow impurity regions in contact with the channel region, wherein a lowermost portion of the channel region is above bottom surfaces of the two channel portion holes, and wherein the channel region is only between the first word line patterns.

11. The method of claim 10, wherein forming the channel region comprises:

forming photoresist patterns that expose the portion of the at least one active region; and ion implanting a dopant material into the portion of the at least one active region by using the photoresist patterns as a mask.

12. The method of claim 11, wherein ion implanting the dopant material comprises ion-implanting P-type impurity ions.

13. The method of claim 11, wherein forming two channel portion holes comprises:

forming a mask layer on the semiconductor substrate;

forming photoresist patterns on the mask layer;

etching the mask layer by using the photoresist patterns as an etching mask to form mask layer patterns on the semiconductor substrate, the mask layer patterns disposed between the first and second word line patterns and parallel to the first and second word line patterns, one of the mask layer patterns disposed to overlap the channel region;

etching the semiconductor substrate by using the device isolation layer, the photoresist patterns, and the mask layer patterns as an etching mask; and removing the photoresist patterns from the semiconductor substrate.

14. The method of claim 13, wherein forming the mask layer comprises forming the mask layer of an insulating material having an etching ratio that is different from that of the semiconductor substrate.

15. The method of claim 11, wherein forming two channel portion holes comprises:

forming a mask layer on the semiconductor substrate;

forming photoresist patterns on the mask layer;

etching the mask layer by using the photoresist patterns as an etching mask to form mask layer patterns on the semiconductor substrate, the mask layer patterns between the first and second word line patterns and parallel to the first and second word line patterns, one of the mask layer patterns overlapping the channel region;

removing the photoresist patterns from the semiconductor substrate; and etching the semiconductor substrate by using the device isolation layer and the mask layer patterns as an etching mask.

16. The method of claim 15, wherein forming the mask layer comprises forming the mask layer of an insulating material having an etching ratio different from that of the semiconductor substrate.

17. The method of claim 10, wherein forming the first and second word line patterns comprises:
    forming a gate conductive layer on the device isolation layer, on the main surface of the semiconductor substrate and in the two channel portion holes;
    forming a gate capping layer on the gate conductive layer; and
    patterning gate conductive layer and the gate capping layer.

18. The method of 10, wherein forming the shallow impurity regions comprises forming the shallow impurity regions using N-type impurity ions.

19. The method of claim 1, wherein at least one of the gate patterns completely fills one of the two channel portion holes.

20. The method of claim 1, further comprising:
    forming a well region within the at least one active region, wherein the predetermined portion of the at least one active region is within the well region, and
    a concentration of impurity ions within the channel region is higher than a concentration of impurity ions within the well region.

21. The method of claim 1, wherein the channel region is formed in the at least one active region before forming the two channel portion holes.

22. The method of claim 1, wherein the channel region extends contiguously from a sidewall of one of the two channel portion holes to a sidewall of the other of the two channel portion holes after forming the shallow impurity regions in the at least one active region.

23. The method of claim 10, wherein at least one of the second word line patterns is outside the two channel portion holes.

* * * * *